United States Patent
Wang et al.

(10) Patent No.: US 12,052,097 B2
(45) Date of Patent: Jul. 30, 2024

(54) CODING METHOD AND APPARATUS

(71) Applicant: HUAWEI TECHNOLOGIES CO., LTD., Shenzhen (CN)

(72) Inventors: Xianbin Wang, Hangzhou (CN); Shengchen Dai, Hangzhou (CN); Huazi Zhang, Hangzhou (CN); Jiajie Tong, Hangzhou (CN); Rong Li, Hangzhou (CN); Jun Wang, Hangzhou (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 18/186,912

(22) Filed: Mar. 20, 2023

(65) Prior Publication Data
US 2023/0283406 A1    Sep. 7, 2023

Related U.S. Application Data

(63) Continuation of application No. PCT/CN2021/114606, filed on Aug. 25, 2021.

(30) Foreign Application Priority Data

Sep. 18, 2020    (CN) .......................... 202010987334.8

(51) Int. Cl.
*G11C 29/00* (2006.01)
*H04L 1/00* (2006.01)

(52) U.S. Cl.
CPC .................... *H04L 1/0057* (2013.01)

(58) Field of Classification Search
USPC ........................................................ 714/776
See application file for complete search history.

(56) References Cited

U.S. PATENT DOCUMENTS

2020/0036477 A1 *   1/2020   Xu ........................ G06F 9/30029
2023/0283406 A1 *   9/2023   Wang .................... H04L 1/0042

* cited by examiner

*Primary Examiner* — Samir W Rizk
(74) *Attorney, Agent, or Firm* — Leydig, Voit & Mayer, Ltd.

(57) ABSTRACT

A coding method and apparatus are provided. The method includes: obtaining a to-be-coded sequence whose length is N, after an information bit is placed at an information bit position, wherein first preset bits are placed at shaping bit positions in a first position sequence, and shaping bit positions whose corresponding bits after polar coding belong to a same subcode of inner code belong to a same group; performing outer code coding on the to-be-coded sequence, to obtain a first outer code sequence whose length is N, based on which first outer code codeword bits corresponding to shaping bit position groups are obtained; obtaining a target outer code sequence based on the first outer code sequence and the first outer code codeword bits; and performing inner code coding on the target outer code sequence, to obtain and output a coded sequence. Probability amplitude shaping (PAS) coding latency can be reduced.

20 Claims, 7 Drawing Sheets

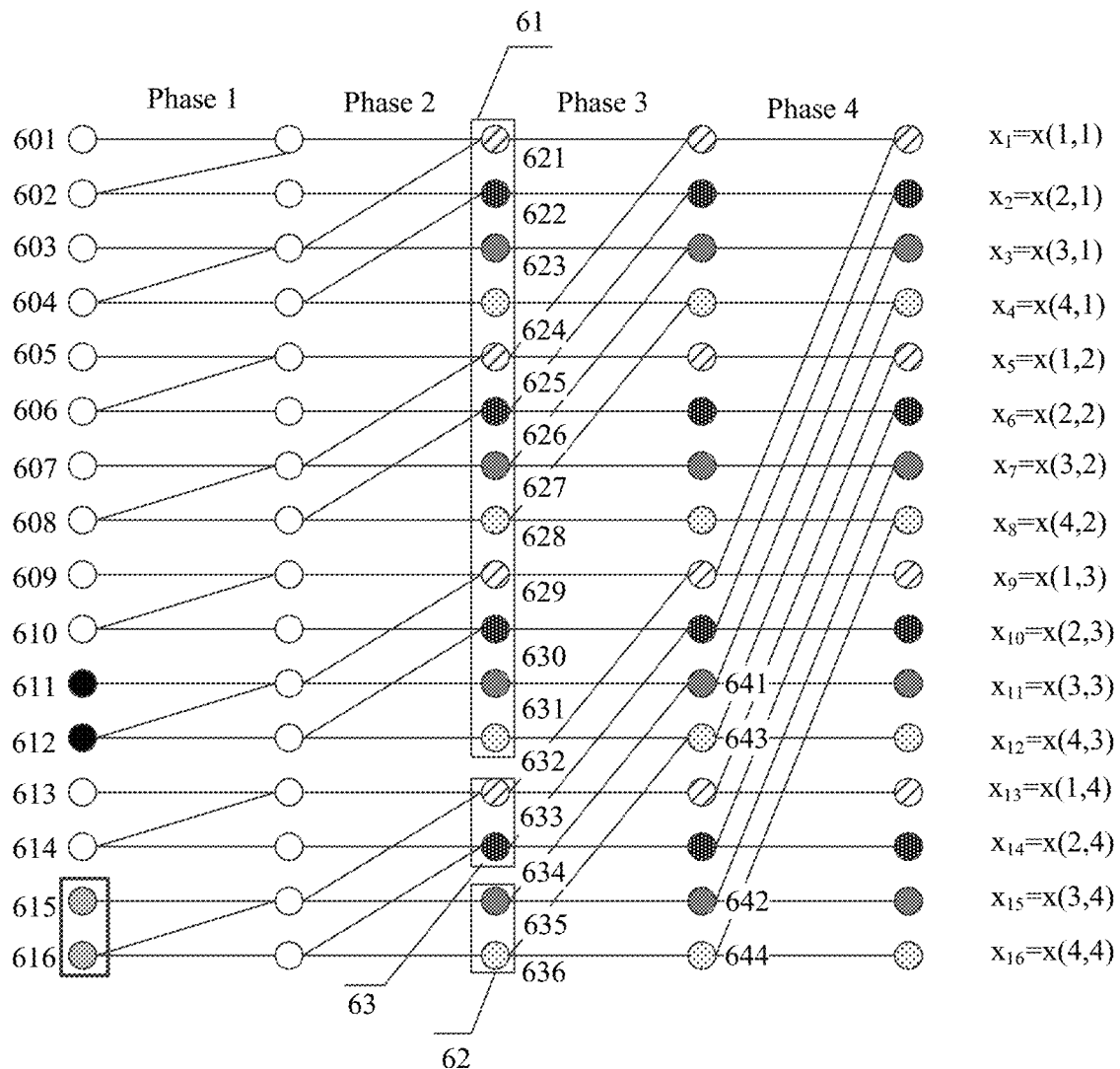

FIG. 6

| | |
|---|---|
| Determine a first quantity of the shaping bits based on a code length, a quantity of information bits in a to-be-encoded sequence, and a modulation order | S701 |
| Determine shaping bit positions of the first quantity in the first position sequence based on the first quantity of shaping bits, the code length, and the quantity of information bits in the to-be-encoded sequence | S702 |

FIG. 7

CODING METHOD AND APPARATUS

CROSS-REFERENCE TO RELATED APPLICATIONS

This application is a continuation of International Application No. PCT/CN2021/114606, filed on Aug. 25, 2021, which claims priority to Chinese Patent Application No. 202010987334.8, filed on Sep. 18, 2020. The disclosures of the aforementioned applications are hereby incorporated by reference in their entireties.

TECHNICAL FIELD

Embodiments of this application relate to the field of communication technologies, and in particular, to a coding method and apparatus.

BACKGROUND

In the field of communication technologies, a communication device (for example, a terminal device or a base station) may perform channel coding and decoding by using a polar code.

In a high throughput coding/decoding scenario, using high order modulation helps further improve system throughput. At present, probability amplitude shaping (PAS) is a common method for implementing high order modulation, but a PAS coding process has long latency.

SUMMARY

Embodiments of this application provide a coding method and apparatus, to reduce PAS coding latency.

According to a first aspect, an embodiment of this application provides a coding method. The method includes: obtaining a to-be-coded sequence whose length is N, where the to-be-coded sequence is obtained after an information bit is placed at an information bit position, a frozen bit is placed at a frozen bit position, and first preset bits are placed at a plurality of shaping bit positions in a first position sequence, bits corresponding to the plurality of shaping bit positions after polar coding belong to a plurality of different subcodes of inner code, and shaping bit positions whose corresponding bits after polar coding belong to a same subcode of inner code belong to a same group of shaping bit positions; performing outer code coding on the to-be-coded sequence, to obtain a first outer code sequence whose length is N; obtaining, in parallel based on the first outer code sequence, a plurality of first outer code codeword bits corresponding to a plurality of groups of shaping bit positions, where the plurality of first outer code codeword bits are the same as the bits corresponding to the plurality of shaping bit positions after outer code coding; obtaining a target outer code sequence based on the first outer code sequence and the plurality of first outer code codeword bits, where the target outer code sequence is the same as a sequence obtained after outer code coding; and performing inner code coding on the target outer code sequence, to obtain and output a coded sequence.

The to-be-coded sequence whose length is N may be generated by a sending device that implements the coding method in this solution, or may be received by a sending device that implements the coding method in this solution from another device. It may be understood that N is a code length of the to-be-coded sequence, and the first preset bit may be 0. The information bit in the to-be-coded sequence in this embodiment may be generated by the sending device in this embodiment, or may be received by the sending device in this embodiment from another device.

In this solution, because the plurality of shaping bit positions form the at least two shaping bit position groups, the at least two shaping bit position groups are in a one-to-one correspondence with the at least two different subcodes of inner code. The at least two subcodes of inner code may be obtained in parallel and independently by performing inner code coding on corresponding outer code codeword bit groups, and vice versa, at least two outer code codeword bit groups may also be obtained in parallel and independently by performing polar decoding. Therefore, the method in this embodiment may use polar decoding to obtain, in parallel, the at least two outer code codeword bit groups corresponding to the at least two shaping bit position groups, where the at least two outer code codeword bit groups include the plurality of first outer code codeword bits. In other words, in the method in this solution, polar decoding may be used to obtain, in parallel, a plurality of first outer code codeword bits corresponding to at least two shaping bit position groups, obtain, based on the plurality of first outer code codeword bits, an outer code sequence obtained after outer code coding, and then perform inner code coding on the outer code sequence to obtain and output a coded sequence, instead of first determining actual shaping bits by using a serial decoding method, to obtain the target to-be-coded sequence, and then performing polar coding on the target to-be-coded sequence to obtain and output the coded sequence. Therefore, PAS coding latency can be greatly reduced.

In a possible implementation, the first outer code sequence includes a second outer code codeword bit corresponding to an information bit position obtained after outer code coding and a third outer code codeword bit corresponding to a first frozen bit position obtained after outer code coding, where generation of the third outer code codeword bit is not related to the bits at the plurality of shaping bit positions. Obtaining any first outer code codeword bit corresponding to any first shaping bit position group in the plurality of groups of shaping bit positions includes: obtaining, based on one or more outer code codeword bits in the second outer code codeword bits and/or the third outer code codeword bits, the first outer code codeword bit corresponding to the first shaping bit position group by using polar decoding, where the first outer code codeword bit corresponding to the first shaping bit position group is the same as a bit corresponding to a first shaping bit position obtained after outer code coding, a bit corresponding to the first shaping bit position group after polar coding and a bit corresponding to a target position belong to a same subcode of inner code, and a bit corresponding to the target position after outer code coding is a target outer code codeword bit.

In this solution, specific implementation of "obtaining, in parallel based on the first outer code sequence, a plurality of first outer code codeword bits corresponding to a plurality of groups of shaping bit positions" is provided. In this solution, the plurality of first outer code codeword bits corresponding to the plurality of groups of shaping bit positions may be obtained in parallel.

In a possible implementation, before obtaining a first target outer code codeword bit based on the target outer code codeword bit by using polar decoding, the method further includes: determining a first length $$\left\lceil \frac{M_1}{\log_2 m} \right\rceil$$

based on N, a modulation order, and a signal-to-noise ratio, where the first position sequence includes $\log_2 m$ first sub-position sequences, the first sub-position sequences include $$\left\lceil \frac{M_1}{\log_2 m} \right\rceil$$

segments, each segment includes $M_2$ positions, $M_1 \times M_2 = N$, m is the modulation order, and $M_1$ and $M_2$ both are positive integers; and determining a polar code of the first length. The obtaining a first target outer code codeword bit corresponding to the first shaping bit position group based on the target outer code codeword bit by using polar decoding includes: performing first order decoding on the polar code of the first length based on the target outer code codeword bit, to obtain the first outer code codeword bit corresponding to the first shaping bit position group.

Each element included in the polar code of the first length may be 1.

In this solution, specific implementation of obtaining, by using polar decoding, the first outer code codeword bit corresponding to any first shaping bit position group of the plurality of shaping bit position groups is provided. The specific implementation is simple and easy to implement.

In a possible implementation, the obtaining a target outer code sequence based on the first outer code sequence and the plurality of first outer code codeword bits includes: obtaining a second outer code sequence whose length is N, where bits that are in the second outer code sequence and that correspond to the plurality of shaping bit positions are the plurality of first outer code codeword bits, and a bit other than the plurality of first outer code codeword bits in the second outer code sequence is a second preset bit; performing system coding on the second outer code sequence to obtain a third outer code sequence whose length is N, where bits that are in the third outer code sequence and that correspond to the plurality of shaping bit positions are the plurality of first outer code codeword bits, a bit that are in the third outer code sequence and that corresponds to a position of a second frozen bit is a fourth outer code codeword bits, another bit in the third outer code sequence is the second preset bit, the fourth outer code codeword bit is the same as a bit corresponding to the position of the second frozen bit obtained after outer code coding, and the second frozen bit is a frozen bit other than the first frozen bit in the to-be-coded sequence; and obtaining the target outer code sequence based on the first outer code sequence and the third outer code sequence. This solution provides a specific implementation of obtaining the target outer code sequence.

In a possible implementation, before the obtaining a to-be-coded sequence whose length is N, the method further includes: determining a first quantity of the shaping bits based on N, a quantity of information bits in the to-be-coded sequence, and the modulation order; and determining the information bit position, a frozen shaping bit position, and shaping bit positions of the first quantity in the first position sequence based on the first quantity, N, and the quantity of information bits.

In a possible implementation, the determining the information bit position, a frozen shaping bit position, and shaping bit positions of the first quantity in the first position sequence based on the first quantity, N, and a quantity of information bits includes: determining a second position sequence based on the first quantity, N, and the quantity of information bits, where the second position sequence includes K+S information bit positions and N−(K+S) frozen bit positions, K is the quantity of information bits, and S is the first quantity; and determining S shaping bit positions from K+S information bit positions in the second position sequence based on N and the quantity of information bits in the to-be-coded sequence, to obtain the first position sequence.

In a possible implementation, the determining a second position sequence based on the first quantity, N, and the quantity of information bits includes: obtaining a third position sequence whose length is N based on the first quantity, N, and the quantity of information bits, where the third position sequence includes K* information bit positions, and $K^* = (\lceil \sqrt{K+S} \rceil)^2$; and if K is greater than K+S, updating K*−(K+S) information bit positions in K* information bit positions to frozen bit positions, to obtain the second position sequence.

In a possible implementation, the second position sequence includes $\log_2 m$ second sub-position sequences, the second sub-position sequences include $$\left\lceil \frac{M_1}{\log_2 m} \right\rceil$$

segments, each segment includes $M_2$ positions, in is the modulation order, $M_1 \times M_2 = N$, and both $M_1$ and $M_2$ are positive integers; and the determining S shaping bit positions from K+S information bit positions in the second position sequence based on N and the quantity of information bits in the to-be-coded sequence, to obtain the first position sequence includes: for the $i^{th}$ sub-position sequence in $\log_2 m$ second sub-position sequences, determining $L_i$ information bit positions with the first $L_i$ reliability in a position sequence whose length is $$\left\lceil \frac{M_1}{\log_2 m} \right\rceil,$$

and updating $S_i$ information bit positions included in $L_i$ target segments in the $i^{th}$ second sub-position sequence to $S_i$ shaping bit positions, to obtain the first position sequence, where the $L_i$ information bit positions indicate $L_i$ target segments, $L_i$ is an integer, i=1, . . . , and $\log_2 m$ and $$\sum_{i=1}^{\log_2 m} S_i = S.$$

$L_i$ is obtained based on the $i^{th}$ quantity of estimated shaping bits in $\log_2 m$ quantities of estimated shaping bits, N, and the quantity of information bits. $\log_2 m$ quantities of estimated shaping bits are obtained based on N, the quantity of information bits in the to-be-coded sequence, and the modulation order. $\log_2 m$ quantities of estimated shaping bits are used to determine the first quantity.

The foregoing solution provides a specific implementation of determining the information bit position, the frozen shaping bit position, and the first quantity of shaping bit positions in the first position sequence. The determined shaping bit positions in the first position sequence in the specific implementation can reduce PAS coding latency. For a specific reason, refer to the descriptions in the first aspect.

In a possible implementation, the determining a first quantity of the shaping bits based on N, a quantity of information bits, and a modulation order includes: obtaining $\log_2 m$ quantities of estimated shaping bits based on N, the quantity of information bits in the to-be-coded sequence, and the modulation order, where m is the modulation order; and determining the first quantity of shaping bits based on $\log_2 m$ quantities of estimated shaping bits, N, and the quantity of information bits.

In a possible implementation, the obtaining the $i^{th}$ quantity of estimated shaping bits in $\log_2 m$ quantities of estimated shaping bits includes: determining a shaping target probability based on N, the quantity of information bits, and the modulation order, where the $i^{th}$ component in the shaping target probability indicates a probability that the $i^{th}$ bit in each modulation symbol is 0; and determining the $i^{th}$ quantity of estimated shaping bits based on the probability that the $i^{th}$ bit in the modulation symbol is 0, N, and the modulation order.

The shaping target probability may be obtained through calculation according to a formula, or may be obtained through searching based on a correspondence. For example, the determining a shaping target probability based on N, the quantity of information bits, and the modulation order includes: determining the shaping target probability based on N, a quantity of information bits in the first position sequence, the modulation order, and a correspondence, where the correspondence includes preset shaping target probabilities respectively corresponding to a plurality of combinations, and each combination corresponds to a preset code length, a preset quantity of information bits, and a preset modulation order, or each combination corresponds to a preset code rate, a preset quantity of information bits, and a preset modulation order. If the shaping target probability is obtained by searching the correspondence, efficiency of obtaining the shaping target probability can be improved.

In a possible implementation, the determining the first quantity of shaping bits based on $\log_2 m$ quantities of estimated shaping bits, N, and the quantity of information bits in the to-be-coded sequence includes: determining $\log_2 m$ quantities of shaping bit segments based on $\log_2 m$ quantities of estimated shaping bits, N, and the quantity of information bits, where the $i^{th}$ quantity $L_i$ of shaping bit segments is obtained based on the $i^{th}$ quantity of estimated shaping bits in $\log_2 m$ quantities of estimated shaping bits, N, and the quantity of information bits, the $i^{th}$ quantity $L_i$ of shaping bit segments is a quantity of segments that are in the $i^{th}$ first sub-position sequence and that include shaping bits, and the first position sequence includes $$\left\lceil \frac{M_1}{\log_2 m} \right\rceil$$

segments, where each segment includes $M_2$ positions, i=1, . . . , and $\log_2 m$; and determining the first quantity of shaping bits based on $\log_2 m$ quantities of shaping bit segments and the quantity of information bits.

According to a second aspect, an embodiment of this application provides a coding apparatus. The apparatus includes an obtaining module and a coding module. The obtaining module is configured to obtain a to-be-coded sequence whose length is N, where the to-be-coded sequence is obtained after an information bit is placed at an information bit position, a frozen bit is placed at a frozen bit position, and first preset bits are placed at a plurality of shaping bit positions in a first position sequence, bits corresponding to the plurality of shaping bit positions after polar coding belong to a plurality of different subcodes of inner code, and shaping bit positions whose corresponding bits after polar coding belong to a same subcode of inner code belong to a same group of shaping bit positions. The coding module is configured to perform outer code coding on the to-be-coded sequence, to obtain a first outer code sequence whose length is N. The coding module is further configured to obtain, in parallel based on the first outer code sequence, a plurality of first outer code codeword bits corresponding to a plurality of groups of shaping bit positions, where the plurality of first outer code codeword bits are the same as the bits corresponding to the plurality of shaping bit positions after outer code coding. The coding module is further configured to obtain a target outer code sequence based on the first outer code sequence and the plurality of first outer code codeword bits, where the target outer code sequence is the same as a sequence obtained after outer code coding. The coding module is further configured to perform inner code coding on the target outer code sequence, to obtain and output a coded sequence.

In a possible implementation, the first outer code sequence includes a second outer code codeword bit corresponding to an information bit position obtained after outer code coding and a third outer code codeword bit corresponding to a first frozen bit position obtained after outer code coding, where generation of the third outer code codeword bit is not related to the bits at the plurality of shaping bit positions. The coding module is specifically configured to: obtain, based on one or more outer code codeword bits in the second outer code codeword bits and/or the third outer code codeword bits, the first outer code codeword bit corresponding to the first shaping bit position group by using polar decoding, where the first outer code codeword bit corresponding to the first shaping bit position group is the same as a bit corresponding to a first shaping bit position obtained after outer code coding, a bit corresponding to the first shaping bit position group after polar coding and a bit corresponding to a target position belong to a same subcode of inner code, and a bit corresponding to the target position after outer code coding is a target outer code codeword bit.

In a possible implementation, before the coding module obtains a first target outer code codeword bit based on the target outer code codeword bit by using polar decoding, the coding module is further configured to: determine a first length $$\left\lceil \frac{M_1}{\log_2 m} \right\rceil$$

based on N, a modulation order, and a signal-to-noise ratio, where the first position sequence includes $\log_2 m$ first sub-position sequences, the first sub-position sequences include $$\left\lceil \frac{M_1}{\log_2 m} \right\rceil$$

segments, each segment includes $M_2$ positions, $M_1 \times M_2 = N$, m is the modulation order, and $M_1$ and $M_2$ both are positive integers; and determine a polar code of the first length. That the coding module obtains the first outer code codeword bit corresponding to the first shaping bit position group based on the target outer code codeword bit by using polar decoding includes: performing first order decoding on the polar code of the first length based on the target outer code codeword bit, to obtain the first outer code codeword bit corresponding to the first shaping bit position group.

In a possible implementation, the coding module is specifically configured to: obtain a second outer code sequence whose length is N, where bits that are in the second outer code sequence and that correspond to the plurality of shaping bit positions are the plurality of first outer code codeword bits, and a bit other than the plurality of first outer code codeword bits in the second outer code sequence is a second preset bit; perform system coding on the second outer code sequence to obtain a third outer code sequence whose length is N, where bits that are in the third outer code sequence and that correspond to the plurality of shaping bit positions are the plurality of first outer code codeword bits, a bit that are in the third outer code sequence and that corresponds to a position of a second frozen bit is a fourth outer code codeword bits, another bit in the third outer code sequence is the second preset bit, the fourth outer code codeword bit is the same as a bit corresponding to the position of the second frozen bit obtained after outer code coding, and the second frozen bit is a frozen bit other than the first frozen bit in the to-be-coded sequence; and obtain the target outer code sequence based on the first outer code sequence and the third outer code sequence.

In a possible implementation, before the obtaining module obtains the to-be-coded sequence whose length is N, the obtaining module is further configured to: determine a first quantity of the shaping bits based on N, a quantity of information bits in the to-be-coded sequence, and the modulation order; and determine the information bit position, a frozen shaping bit position, and shaping bit positions of the first quantity in the first position sequence based on the first quantity, N, and the quantity of information bits.

In a possible implementation, the obtaining module is specifically configured to: determine a second position sequence based on the first quantity, N, and the quantity of information bits, where the second position sequence includes K+S information bit positions and N−(K+S) frozen bit positions, K quantity of information bits, and S is the first quantity; and determine S shaping bit positions from K+S information bit positions in the second position sequence based on N and the quantity of information bits in the to-be-coded sequence, to obtain the first position sequence.

In a possible implementation, the obtaining module is specifically configured to: obtain a third position sequence whose length is N based on the first quantity, N, and the quantity of information bits, where the third position sequence includes K* information bit positions, and K*=($\lceil \sqrt{K+S} \rceil$)$^2$; and if K* is greater than K+S, update K*−(K+S) information bit positions in K* information bit positions to frozen bit positions, to obtain the second position sequence.

In a possible implementation, the second position sequence includes $\log_2 m$ second sub-position sequences, the second sub-position sequences include $$\left\lceil \frac{M_1}{\log_2 m} \right\rceil$$

segments, each segment includes $M_2$ positions, m is the modulation order $M_1 \times M_2 = N$ and both $M_1$ and $M_2$ are positive integers; and that the obtaining module determines s shaping bit positions from K+S information bit positions in the second position sequence based on N and the quantity of information bits in the to-be-coded sequence, to obtain the first position sequence includes: for the $i^{th}$ sub-position sequence in $\log_2 m$ second sub-position sequences, determining $L_i$ information bit positions with the first $L_i$ reliability in a position sequence whose length is $$\left\lceil \frac{M_1}{\log_2 m} \right\rceil,$$

and updating $S_i$ information bit positions included in $L_i$ target segments in the $i^{th}$ second sub-position sequence to $S_i$ shaping bit positions, to obtain the first position sequence, where the $L_i$ information bit positions indicate $L_i$ target segments, $L_i$ is an integer, i=1, . . . , and $\log_2 m$, and $$\sum_{i=1}^{\log_2 m} S_i = S.$$

$L_i$ is obtained based on the $i^{th}$ quantity of estimated shaping bits in $\log_2 m$ quantities of estimated shaping bits, N, and the quantity of information bits. $\log_2 m$ quantities of estimated shaping bits are obtained based on N, the quantity of information bits in the to-be-coded sequence, and the modulation order. $\log_2 m$ quantities of estimated shaping bits are used to determine the first quantity.

In a possible implementation, the obtaining module is specifically configured to: obtain $\log_2 m$ quantities of estimated shaping bits based on N, the quantity of information bits in the to-be-coded sequence, and the modulation order, where m is the modulation order; and determine the first quantity of shaping bits based on $\log_2 m$ quantities of estimated shaping bits, N, and the quantity of information bits.

In a possible implementation, the obtaining module is specially configured to: determine a shaping target probability based on N, the quantity of information bits, and the modulation order, where the $i^{th}$ component in the shaping target probability indicates a probability that the $i^{th}$ bit in each modulation symbol is 0; and determine the $i^{th}$ quantity of estimated shaping bits based on the probability that the $i^{th}$ bit in the modulation symbol is 0, N, and the modulation order.

In a possible implementation, the obtaining module is specifically configured to: determine the shaping target probability based on N, a quantity of information bits in the first position sequence, the modulation order, and a correspondence, where the correspondence includes preset shaping target probabilities respectively corresponding to a plurality of combinations, and each combination corresponds to a preset code length, a preset quantity of information bits, and a preset modulation order, or each combination corresponds to a preset code rate, a preset quantity of information bits, and a preset modulation order.

In a possible implementation, the obtaining module is specifically configured to: determine $\log_2 m$ quantities of shaping bit segments based on $\log_2 m$ quantities of estimated shaping bits, N, and the quantity of information bits, where the $i^{th}$ quantity $L_i$ of shaping bit segments is obtained based on the $i^{th}$ quantity of estimated shaping bits in $\log_2 m$ quantities of estimated shaping bits, N, and the quantity of information bits, the $i^{th}$ quantity $L_i$ of shaping bit segments is a quantity of segments that are in the $i^{th}$ first sub-position sequence and that include shaping bits, and the first position sequence includes $$\left\lceil \frac{M_1}{\log_2 m} \right\rceil$$

segments, where each segment includes $M_2$ positions, i=1, . . . , and $\log_2 m$; and determine the first quantity of shaping bits based on $\log_2 m$ quantities of shaping bit segments and the quantity of information bits.

According to a third aspect, an embodiment of this application provides a coding apparatus, including at least one processor and a memory communicatively connected to the at least one processor. The memory stores instructions that can be executed by the at least one processor, and the instructions are executed by the at least one processor, so that the at least one processor can perform the coding method according to any one of the first aspect or the possible implementations of the first aspect.

According to a fourth aspect, an embodiment of this application provides a coding apparatus, including an input interface, a logic circuit, and an output interface. The input interface is configured to obtain information bits. The logic circuit is configured to perform, based on the information bits, the coding method according to any one of the first aspect or the possible implementations of the first aspect, to obtain a coded sequence. The output interface is configured to output the coded sequence.

According to a fifth aspect, an embodiment of this application provides a storage medium. The storage medium includes a computer program, and the computer program is used to implement the coding method in any one of the first aspect or the possible implementations of the first aspect.

BRIEF DESCRIPTION OF DRAWINGS

FIG. 6 is a schematic diagram of a coding process according to an embodiment of this application;

FIG. 7 is a flowchart 2 of a coding method according to an embodiment of this application;

DESCRIPTION OF EMBODIMENTS

Figure 1:
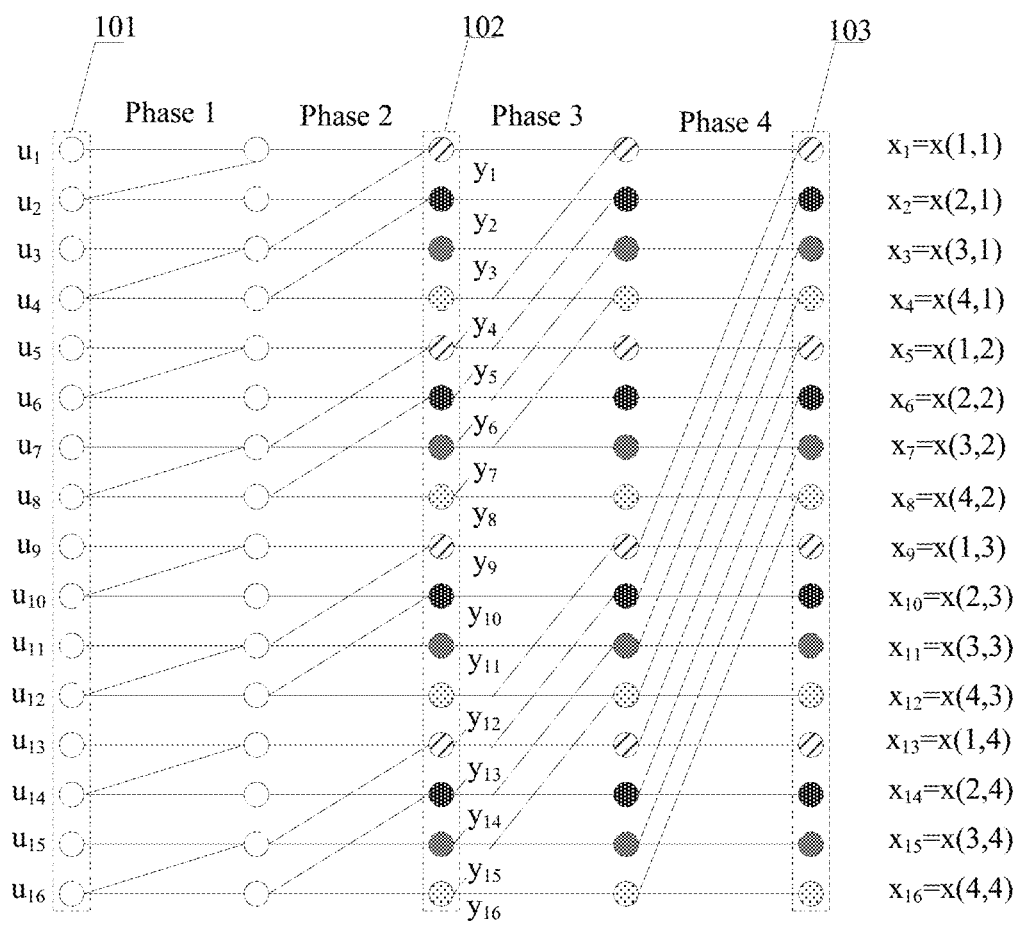
FIG. 1 is a polar code butterfly diagram according to an embodiment of this application.

Embodiments of this application may be used in various fields in which polar coding is used, for example, a data storage field, an optical network communication field, or a wireless communication field. The wireless communication system mentioned in embodiments of this application includes but is not limited to three application scenarios of a narrowband internet of things (NB-IoT for short) system, WiMAX, a long term evolution (LTE for short) system, and a 5G mobile communication system new radio (NR for short), where the three application scenarios are: enhanced mobile broadband (eMBB for short), ultra reliable low latency communication (URLLC for short), and massive machine-type communications (mMTC for short). Embodiments of this application may be further applied to a vehicle to everything (V2X) communication system and a satellite communication system. Certainly, there may be another field in which polar coding is used. This is not specifically limited in this application.

The following describes related concepts in embodiments of this application.

1. A terminal device includes but is not limited to a mobile station (MS), a mobile terminal (MT), a mobile phone (mobile telephone, MT), a mobile phone (handset), a portable device (portable equipment), and the like. The terminal device may communicate with one or more core networks through a radio access network (RAN). For example, the terminal device may be a mobile phone (or referred to as a "cellular" phone), or a computer having a wireless communication function. The terminal device may be alternatively a portable, pocket-sized, handheld, computer-built-in, or in-vehicle mobile apparatus or device, a wearable device, or a device having a terminal function in an internet of things (IoT for short).

2. The network device may be an evolved NodeB (eNB or eNodeB for short) in an LTE system. Alternatively, the network device may be a gNB or a transmission reception point (TRP for short) in a 5G communication system, a micro base station, or the like. Alternatively, the network device may be a relay station, an access point, a vehicle-mounted device, a wearable device, a network device in a future evolved public land mobile network (PLMN for short) or in a network in which a plurality of other technologies are converged or a base station in other various evolved networks, and the like.

3. Polar coding: Polar coding may also be referred to as polar coding, and polar coding may be described in the following two manners.

In one manner, a coding process may be represented by using a generator matrix, that is $x_1^N = u_1^N G_n$, where $u_1^N$ is a sequence before polar coding, and $x_1^N$ is a sequence after polar coding.

$u_1^N$ is a row vector, where $u_1^N = (u_1, u_2, \ldots, u_N)$, N is a code length, and N is an integer greater than or equal to 1. $u_j$ is a bit before coding, and j is an integer between 1 and N. $u_1^N$ includes an information bit and a frozen bit, and may further include a shaping bit, that is, $u_j$ may be an information bit, a frozen bit, or a shaping bit. The information bit is a bit used to carry information, and the information bit may include a cyclic redundancy check (CRC) bit and/or a parity check (PC) bit. The frozen bit is a padding bit, and the frozen bit may be usually 0. The shaping bit is a bit used to implement probabilistic constellation shaping, and is usually 0 or 1.

$G_N$ is a generator matrix, $G_N$ is a matrix of N×N, and $G_N = B_N F_2^{\otimes (\log_2(N))}$. $B_N$ is a transpose matrix of N×N. For example, $B_N$ may be a bit reversal matrix.

$$F_2 = \begin{bmatrix} 1 & 0 \\ 1 & 1 \end{bmatrix},$$

and $F_2^{\otimes(\log_2(N))}$ is a kronecker product of $\log_2 N$ matrices $F_2$. Both addition and multiplication above are operations in a binary galois field. $G_N$ may also be referred to as a generator matrix core.

In a first specific implementation, $G_N = G_i G_o$, and $x_1^N = u_1^N G_N = u_1^N G_i G_o$. In this case, they may be written as $Z_1^N = u_1^N G_i$, $x_1^N = Z_1^N G_o$, where $$G_o = G_{\frac{n}{2}} \otimes \begin{bmatrix} 1 & 0 \\ 0 & 1 \end{bmatrix}^{\otimes \frac{n}{2}}, G_i = \begin{bmatrix} 1 & 0 \\ 0 & 1 \end{bmatrix}^{\otimes \frac{n}{2}} \otimes G_{\frac{n}{2}},$$

and $$G_{\frac{n}{2}} = \begin{bmatrix} 1 & 0 \\ 1 & 1 \end{bmatrix}^{\otimes \frac{n}{2}}.$$

In a second specific implementation, $G_N = G_o G_i$, and in this case, $x_1^N = u_1^N G_N = u_1^N G_o G_i$. In this case, it may be written as $Z_1^N = u_1^N G_o$, where $x_1^N = Z_1^N G_i$.

A process of obtaining $Z_1^N$ is referred to as an outer code coding process, and a process of obtaining $x_1^N$ based on $Z_1^N$ is referred to as an inner code coding process. Polar coding includes the outer code coding process and the inner code coding process, and $Z_1^N$ is an outer code sequence obtained after the outer code coding is performed on a sequence $u_1^N$ before polar coding. The sequence $x_1^N$ obtained after polar coding includes at least two subcodes of inner code. The outer code sequence $Z_1^N$ may be divided into at least two outer code codeword bit groups, and one subcode of inner code is obtained after the inner code coding is performed on each outer code codeword bit group. In other words, the at least two outer code codeword bit groups are in a one-to-one correspondence with at least two subcodes of inner code. In other words, each of the at least two subcodes of inner code may be independently obtained by performing inner code coding on a corresponding outer code codeword bit group.

In another manner, a coding process may be represented by using a polar code butterfly diagram.

Polar coding may be considered as a left-to-right n order operation process, where $$n = \left\lceil \frac{\log_2 N}{2} \right\rceil,$$

and N is a code length. The first n/2 orders correspond to the outer code coding process, and the last n/2 orders correspond to the inner code coding process. Bits in the $n/2^{th}$ column in the polar code butterfly diagram are obtained after the outer code coding is performed on bits before polar coding. Each bit in the $n/2^{th}$ column may be referred to as an outer code codeword bit, and the outer code codeword bits form an outer code sequence. Bits in the $n^{th}$ in the polar code butterfly diagram are obtained after the inner code coding is performed on the outer code codeword bits, and the bits in the $n^{th}$ column form a polar-coded sequence.

With reference to FIG. 1, the following describes a process of performing polar coding based on a polar code butterfly diagram by using an example.

FIG. 1 is a polar code butterfly diagram according to an embodiment of this application. Refer to FIG. 1. A coding code length N corresponding to the polar code butterfly diagram is 16, and n=4, a phase 1 and a phase 2 correspond to an outer code coding process, and a phase 3 and a phase 4 correspond to an inner code coding process. Each dot in FIG. 1 represents one bit. Bits represented by dots in column 0 of the polar code butterfly diagram are $u_1, u_2, \ldots, u_{16}$, which are bits before polar coding. Bits represented by dots in column 4 of the polar code butterfly diagram are $x_1, x_2, \ldots, x_{16}$, which are bits after polar coding.

In FIG. 1, bits in a dashed box 101 are bits before coding, bits in a dashed box 102 are bits in column 2 in the polar code butterfly diagram, and bits in a dashed box 103 are bits in column 4 in the polar code butterfly diagram. The bits in the dashed box 102 are obtained after outer code coding is performed on the bits in the dashed box 101. Each bit in the dashed box 102 may be referred to as outer code codeword bits, and the bits in the dashed box 102 form an outer code sequence. A polar-coded sequence is obtained after inner code coding is performed on the outer code sequence. The bits included in the polar-coded sequence are shown in the bits in the dashed box 103, and the bits in the dashed box 103 may also be referred to as inner code codeword bits. The polar-coded sequence includes four subcodes of inner code. $x_j > x(a,b)$ in FIG. 1 indicates that $x_j$ is the $b^{th}$ bit in the $a^{th}$ subcode of inner code included in the polar-coded sequence. To be specific, the polar-coded sequence includes a first subcode of inner code $[x_1, x_5, x_9, x_{13}]$, a second subcode of inner code $[x_2, x_6, x_{10}, x_{14}]$, a third subcode of inner code $[x_3, x_7, x_{10}, x_{15}]$, and a fourth subcode of inner code $[x_4, x_8, x_{11}, x_{16}]$. The first subcode of inner code is obtained after inner code coding is performed on a first outer code codeword bit group $[y_1, y_5, y_9, y_{13}]$ included in the outer code sequence, the second subcode of inner code is obtained after inner code coding is performed on a second outer code codeword bit group $[y_2, y_6, y_{10}, y_{14}]$ included in the outer code sequence, the third subcode of inner code is obtained after inner code coding is performed on a third outer code codeword bit group $[y_3, y_7, y_{11}, y_{15}]$ included in the outer code sequence, and the fourth subcode of inner code is obtained after inner code coding is performed on a fourth outer code codeword bit group $[y_4, y_8, y_{12}, y_{16}]$ included in the outer code sequence. It may be learned from FIG. 1 that each of the four subcodes of inner code is independently obtained by performing inner code coding on the corresponding outer code codeword bit group.

A polar coding process corresponding to the polar code butterfly diagram shown in FIG. 1 is $x_1^N = u_1^N G_N = u_1^N G_i G_o$.

Figure 2:
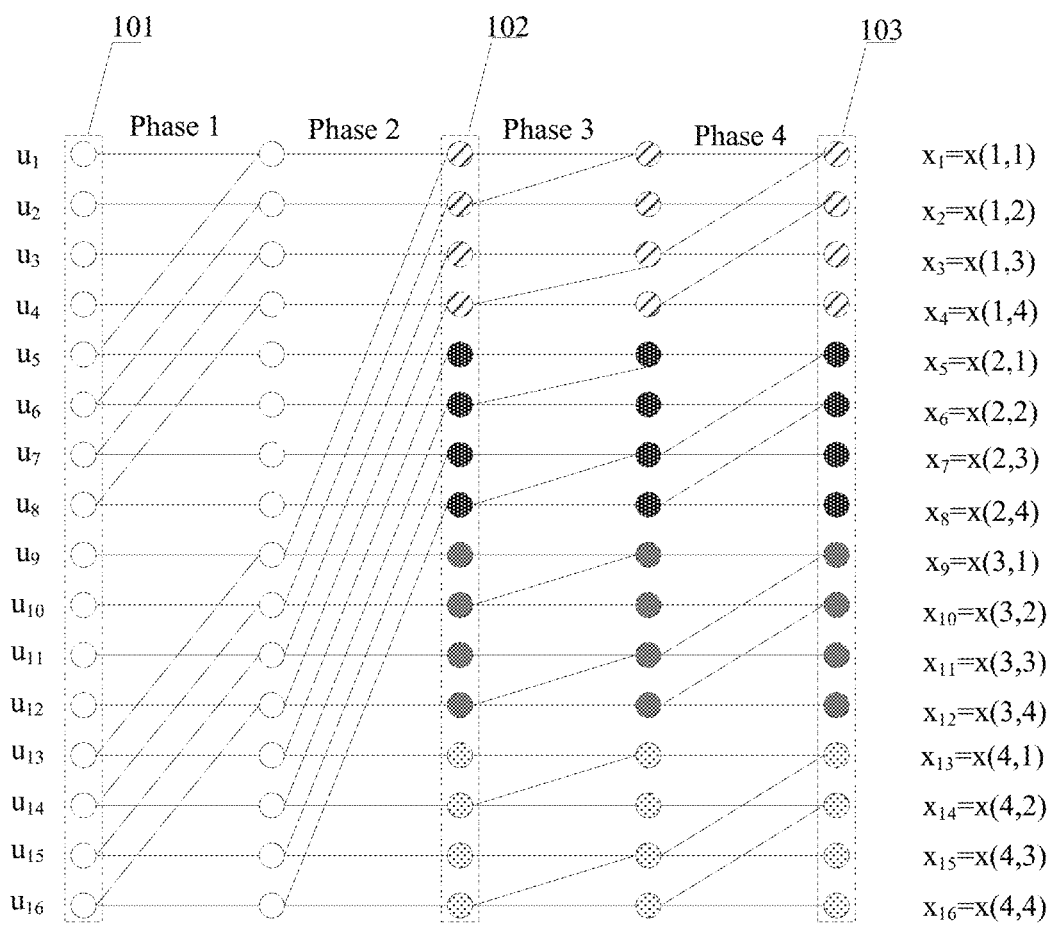
FIG. 2 is another polar code butterfly diagram according to an embodiment of this application.

FIG. 2 is another polar code butterfly diagram according to an embodiment of this application. A difference between FIG. 2 and FIG. 1 lies in that bits $x_1, x_2, x_3, x_4$ belong to a same subcode of inner code, bits $x_5, x_6, x_7, x_8$ belong to a same subcode of inner code, bits $x_9, x_{10}, x_{11}, x_{12}$ belong to a same subcode of inner code, and bits $x_{13}, x_{14}, x_{15}, x_{16}$ belong to a same subcode of inner code.

A polar coding process corresponding to the polar code butterfly diagram shown in FIG. 2 is $x_1^N = u_1^N G_N = u_1^N G_o G_i$.

It may be understood that, a coding result obtained by using the polar code butterfly diagram shown in FIG. 1 is the same as a coding result obtained by using the polar code butterfly diagram shown in FIG. 2.

4. A sequence indicating an information bit position, a shaping bit position, and a frozen bit position may be referred to as a position sequence, or may be referred to as an indicating vector. If the $a^{th}$ position in the position sequence is a bit position A, the $a^{th}$ bit in an outer code sequence may be referred to as a bit that corresponds to the bit position A and that is obtained after outer code coding, a bit corresponding to the bit position A in the outer code sequence, or an outer code codeword bit corresponding to the bit position A. The $a^{th}$ bit in a polar-coded sequence is a bit that corresponds to the bit position A and that is obtained after polar coding, or a bit that corresponds to the bit position A and that is in the polar-coded sequence, or an inner code codeword bit corresponding to the bit position A, where the bit position A is an information bit position, a shaping bit position, or a frozen bit position.

For example, a position sequence is [0,0,1,1,0,2,1,1,]. In the position sequence, a position of an element "0" is a frozen bit position, that is, the first position, a second position, and a fifth position are frozen bit position. A position of an element "1" is an information bit position, that is, the third position, the fourth position, the seventh position, and the eighth position are information bit positions. A position of an element "2" is a shaping bit position, that is, the sixth position is a shaping bit position. In this case, the first, the second, and the fifth bits in the outer code sequence are bits corresponding to frozen bit positions obtained after outer code coding. The third, the fourth, the seventh, and the eighth bits in the outer code sequence are bits corresponding to information bit positions obtained after outer code coding. The sixth bit in the outer code sequence is a bit corresponding to a shaping bit position obtained after outer code coding. The first, the second, and the fifth bits in the polar-coded sequence are bits corresponding to frozen bit positions obtained after polar coding. The third, the fourth, the seventh, and the eighth bits in the polar-coded sequence are bits corresponding to information bit positions obtained after polar coding. The sixth bit in the polar-coded sequence is a bit corresponding to a shaping bit position obtained after polar coding.

Still refer to FIG. 1. If $u_2$ is located at an information bit position 1, $y_2$ is a bit corresponding to the information bit position 1 obtained after outer code coding, which may alternatively be referred to as an outer code codeword bit corresponding to the information bit position 1, and $x_2$ is a bit corresponding to the information bit position 1 obtained after polar coding.

5. Probabilistic constellation shaping is to unevenly distribute signal points in an equidistant constellation diagram, to reduce a probability that a signal with high energy occurs and increase a probability that a signal with low energy occurs. Modulation symbols are in a one-to-one correspondence with the signal points. In other words, because of shaping bits in an uncoded sequence $u_1^N$, modulated modulation symbols of a coded sequence obtained after polar coding are not evenly distributed, the probability that a signal with high energy occurs is reduced, and the probability that a signal with low energy occurs is increased.

For better understanding of this application, the following describes a current problem.

In a high throughput coding/decoding scenario, using high order modulation helps further improve system throughput. At present, probability amplitude shaping (PAS) is a common method for implementing high order modulation, but a PAS coding process has long latency. A main reason is as follows.

Figure 3:
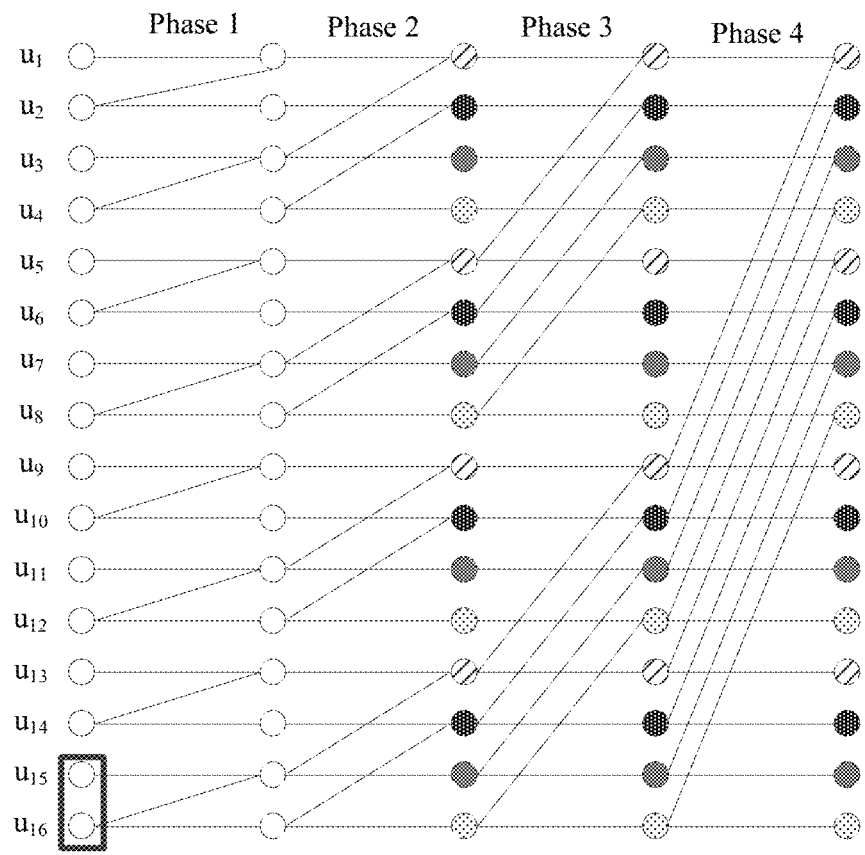
FIG. 3 is a schematic diagram of positions of shaping bits in a polar code butterfly diagram according to an embodiment of this application.

In a PAS coding process, an information bit position, a shaping bit position, and a frozen bit position first need to be determined, an information bit is placed at the information bit position, a frozen bit is placed at the frozen bit position, and a shaping bit is placed at the shaping bit position, to obtain a to-be-coded sequence. However, the shaping bit needs to be obtained through polar decoding. For example, as shown in FIG. 3, bits in a black box are shaping bits. When the shaping bits are obtained through decoding, it may be learned, based on a structure of a polar code butterfly diagram, that the shaping bits may be obtained only through serial decoding. Consequently, long latency exists in a PAS coding process.

To resolve a problem that long latency exists in a PAS coding process, a coding method in this application is proposed.

Figure 4:
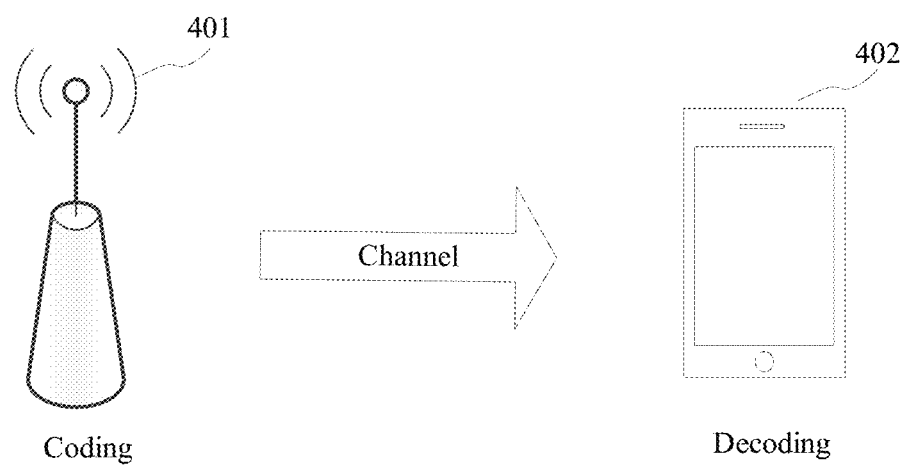
FIG. 4 is a diagram of an architecture of a communication system according to an embodiment of this application.

A diagram of an architecture of a communication system applicable to embodiments of this application may be shown in FIG. 4. FIG. 4 is the diagram of the architecture of the communication system according to embodiments of this application. Refer to FIG. 4. The communication system includes a sending device 401 and a receiving device 402.

Optionally, when the sending device 401 is a terminal device, the receiving device 402 is a network device. When the sending device 401 is a network device, the receiving device 402 is a terminal device.

Refer to FIG. 4. The sending device 401 includes a coder, so that the sending device 401 can perform polar coding and output a coded sequence. The coded sequence is modulated and transmitted to the receiving device 402 on a channel. The receiving device 402 includes a decoder, and the receiving device 402 may receive a signal sent by the sending device 401, and decode the received signal.

It should be noted that FIG. 4 is merely an example of the diagram of the architecture of the communication system, and does not limit the diagram of the architecture of the communication system.

The following describes the coding method in this application by using a specific embodiment.

Figure 5:
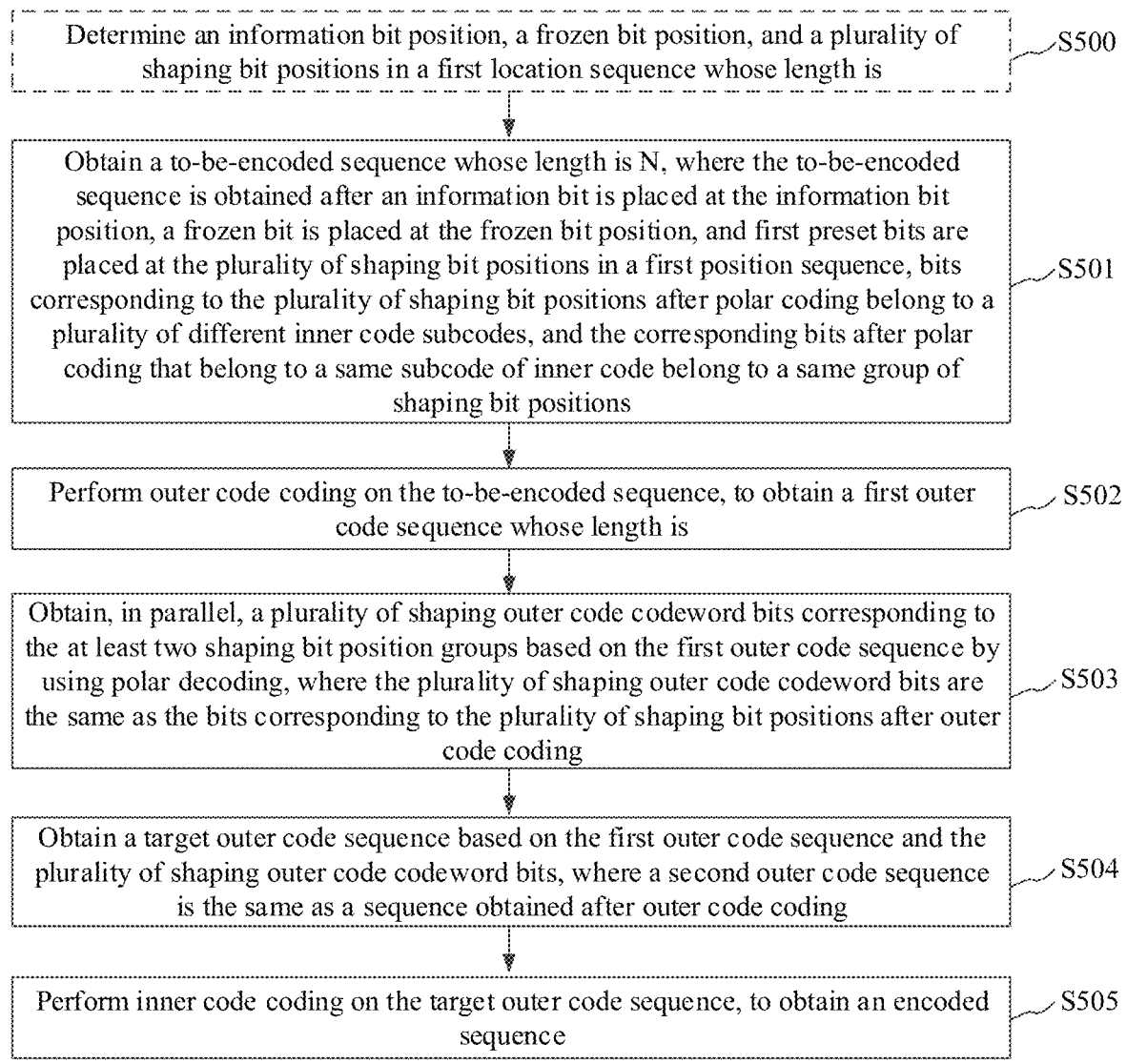
FIG. 5 is a flowchart 1 of a coding method according to an embodiment of this application.

FIG. 5 is a flowchart 1 of a coding method according to an embodiment of this application. The method in this embodiment is applied to a sending device. Refer to FIG. 5. The method in this embodiment includes the following steps.

Step S501: Obtain a to-be-coded sequence whose length is N, where the to-be-coded sequence is obtained after an information bit is placed at an information bit position, a frozen bit is placed at a frozen bit position, and first preset bits are placed at a plurality of shaping bit positions in a first position sequence, bits corresponding to the plurality of shaping bit positions after polar coding belong to a plurality of different subcodes of inner code, and shaping bit positions whose corresponding bits after polar coding belong to a same subcode of inner code belong to a same group of shaping bit positions.

In other words, the plurality of shaping bit positions form at least two shaping bit position groups.

The to-be-coded sequence whose length is N may be generated by the sending device in this embodiment, or may be received by the sending device in this embodiment from another device. It may be understood that N is a code length of the to-be-coded sequence. The first preset bit in this embodiment may be 0.

If the to-be-coded sequence whose length is N is generated by the sending device, before step S501, the method further includes step S500. Step S500: Determine the information bit position, the frozen bit position, and the plurality of shaping bit positions in the first position sequence whose length is N. Correspondingly, the obtaining the to-be-coded sequence whose length is N includes: placing the information bit at the information bit position, placing the frozen bit at the frozen bit position, and placing the first preset bits at the plurality of shaping bit positions in the first position sequence, to obtain the to-be-coded sequence whose length is N. The bits corresponding to the plurality of shaping bit positions after polar coding belong to at least two different subcodes of inner code. The plurality of shaping bit positions form the at least two shaping bit position groups. Bits corresponding to shaping bit positions in a same shaping bit position group after polar coding belong to a same subcode of inner code. N is a positive integer. That is, the at least two shaping bit position groups are in a one-to-one correspondence with the at least two subcodes of inner code.

If the to-be-coded sequence whose length is N is received from another device, the another device may perform the following steps: determining the information bit position, the frozen bit position, and the plurality of shaping bit positions in the first position sequence whose length is N; placing the information bit at the information bit position, placing the frozen bit at the frozen bit position, and placing the first preset bits at the plurality of shaping bit positions in the first position sequence, to obtain the to-be-coded sequence whose length is N; and sending the to-be-coded sequence whose length is N to the sending device in this embodiment.

The information bit in the to-be-coded sequence in this embodiment may be generated by the sending device in this embodiment, or may be received by the sending device in this embodiment from another device.

Step S502: Perform outer code coding on the to-be-coded sequence, to obtain a first outer code sequence whose length is N.

If the to-be-coded sequence is denoted as U, and the first outer code sequence is $X_o$, $X_o = U \times G_i$, or $X_o = U \times G_o$.

The first outer code sequence includes a second outer code codeword bit corresponding to an information bit position obtained after outer code coding and a third outer code codeword bit corresponding to a first frozen bit position obtained after outer code coding, where generation of the third outer code codeword bit is not related to the bits at the plurality of shaping bit positions. Frozen bits other than the first frozen bit in the to-be-coded sequence are referred to as second frozen bits. It may be understood that, because a bit at a code position of a second frozen outer code obtained after outer code coding is related to a shaping bit, and the shaping bit is set to the first preset bit because the shaping bit is unknown, the first outer code sequence does not include a bit corresponding to the code position of the second frozen outer code obtained after outer code coding or bits corresponding to positions of a plurality of shaping bits obtained after outer code coding. In other words, the first outer code sequence does not include an outer code codeword bit corresponding to the code position of the second frozen outer code or outer code codeword bits corresponding to the positions of the plurality of shaping bits.

For example, refer to FIG. 6. Bits 601 to 610 are first frozen bits in a to-be-coded sequence, bits 611 and 612 are information bits in the to-be-coded sequence, bits 613 and 614 are second frozen bits in the to-be-coded sequence, bits 615 and 616 are first preset bits in the to-be-coded sequence, and positions at which the bits 615 and 616 are located are shaping bit positions. A first bit sequence obtained after outer code coding is performed on the to-be-coded sequence including the bits 601 to 616 includes third outer code codeword bits 621 to 630 corresponding to positions of first frozen bits obtained after outer code coding and second outer code codeword bits 631 and 632 corresponding to positions of information bits obtained after outer code coding. That is, in this example, the third outer code codeword bits corresponding to the positions of the first frozen bits after outer code coding and the second outer code codeword bits corresponding to the positions of the information bits are obtained, as shown in a solid box 61.

In other words, by performing outer code coding on the to-be-coded sequence, the second outer code codeword bits corresponding to the positions of the information bits and the third outer code codeword bits corresponding to the positions of the first frozen bits.

Step S503: Obtain, in parallel, a plurality of first outer code codeword bits corresponding to the at least two shaping bit position groups based on the first outer code sequence by using polar decoding.

The first outer code codeword bits corresponding to the shaping bit positions are bits that are in a polar code butterfly diagram and that are located in the $n/2^{th}$ column of the same row as the bits at the shaping bit positions. In other words, the plurality of first outer code codeword bits are the same as the bits corresponding to the plurality of shaping bit positions after outer code coding. It may be understood that a meaning that the plurality of first outer code codeword bits are the same as the bits corresponding to the plurality of shaping bit positions after outer code coding is as follows. The plurality of first outer code codeword bits are equivalent to "bits that are in a sequence obtained after outer code coding is performed on a target to-be-coded sequence and that correspond to the plurality of shaping bit positions". If actual shaping bits are known, a sequence obtained after placing the information bit at the information bit position, placing the frozen bit at the frozen bit position, and placing the actual shaping bits at the plurality of shaping bit positions in the first position sequence is the target to-be-coded sequence.

Because the plurality of shaping bit positions form the at least two shaping bit position groups, the at least two shaping bit position groups are in a one-to-one correspondence with the at least two different subcodes of inner code. The at least two subcodes of inner code may be obtained in parallel and independently by performing inner code coding on corresponding outer code codeword bit groups, and vice versa, at least two outer code codeword bit groups may also be obtained in parallel and independently by performing polar decoding. Therefore, the method in this embodiment may use polar decoding to obtain, in parallel, the at least two outer code codeword bit groups corresponding to the at least two shaping bit position groups, where the at least two outer code codeword bit groups include the plurality of first outer code codeword bits.

In a solution, obtaining the first outer code codeword bit corresponding to any first shaping bit position group of the plurality of shaping bit position groups based on the first outer code sequence by using polar decoding includes: obtaining, based on a target outer code codeword bit in the second outer code codeword bit and/or the third outer code codeword bit in the first outer code sequence, a first outer code codeword bit corresponding to a first shaping bit position group by using polar decoding, where a first target outer code codeword bit is the same as a bit corresponding to a first shaping bit position group obtained after outer code coding, a bit corresponding to a first shaping bit position after polar coding and a bit corresponding to a target position belong to a same subcode of inner code, and a bit corresponding to the target position after outer code coding is a target outer code codeword bit.

Before the obtaining the first outer code codeword bit corresponding to the first shaping bit position group based on the target outer code codeword bit by using polar decoding, the method further includes: determining a first length based on the code length N, a modulation order, and a signal-to-noise ratio; and determining a polar code of the first length. The first length may be $$\left\lceil \frac{M_1}{\log_2 m} \right\rceil,$$

all bits included in the polar code of the first length may be 1, $M_1 \times M_2 = N$, and when $$M_1 = M_2 = \sqrt{N}, \left\lceil \frac{M_1}{\log_2 m} \right\rceil = \left\lceil \frac{\sqrt{N}}{\log_2 m} \right\rceil.$$

Correspondingly, the obtaining the first outer code codeword bit corresponding to the first shaping bit position group based on the target outer code codeword bit by using polar decoding includes: performing first order decoding on the polar code of the first length based on the target outer code codeword bit, to obtain the first outer code codeword bit corresponding to the first shaping bit position group.

For example, still refer to FIG. 6. A code length N corresponding to FIG. 6 is 16, m=4 $M_1 = M_2 = 4$, and $$\left\lceil \frac{M_1}{\log_2 m} \right\rceil = 2.$$

Positions of bits 615 and 616 are both shaping bit positions, and the two shaping bit positions correspond to two shaping bit position groups: a shaping bit position group a and a shaping bit position group b. The shaping bit position group a includes the shaping bit position c at which the bit 615 is located, and the shaping bit position group b includes the shaping bit position d at which the bit 616 is located.

When a first outer code codeword bit 635 corresponding to the shaping bit position group a is obtained, both bits 641 and 642 are set to 1, to obtain a first polar code that includes the bits 641 and 642 and whose length is 2. The first polar code is decoded based on a bit 631, to obtain the first outer code codeword bit 635 corresponding to the shaping bit position group a. In this case, a position at which the bit 611 is located is a target position, and the bit 631 is a target outer code codeword bit corresponding to the target position obtained after outer code coding. It may be learned from FIG. 6 that a bit $x_{11}$ corresponding to the shaping bit position c at which the bit 615 after polar coding is located and a bit $x_{15}$ corresponding to the target position belong to a same subcode of inner code.

When a first outer code codeword bit 636 corresponding to the shaping bit position group b is obtained, both bits 643 and 644 are set to 1, to obtain a second polar code that includes the bits 643 and 644 and whose length is 2. The second polar code is decoded based on a bit 632, to obtain the first outer code codeword bit 636 corresponding to the shaping bit position group b. In this case, a position at which the bit 612 is located is a target position, and the bit 632 is a target outer code codeword bit corresponding to the target position obtained after outer code coding. It may be learned from FIG. 6 that a bit $x_{12}$ corresponding to the shaping bit position d at which the bit 616 after polar coding is located and a bit $x_{16}$ corresponding to the target position belong to a same subcode of inner code.

In conclusion, a process of obtaining the first outer code codeword bit 635 corresponding to the shaping bit position group a and a process of obtaining the first outer code codeword bit 636 corresponding to the shaping bit position group b are independent of each other, and the first outer code codeword bit 635 and the first outer code codeword bit 636 may be obtained in parallel.

In this example, the plurality of first outer code codeword bits 635 and 636 corresponding to the shaping bit position group a and the shaping bit position group b are obtained, as shown in a solid block 62 in FIG. 6.

That is, the plurality of first outer code codeword bits corresponding to the shaping bit positions may be obtained based on the first outer code sequence by using polar decoding.

Step S504: Obtain a target outer code sequence based on the first outer code sequence and the plurality of first outer code codeword bits.

Outer code codeword bits in the target outer code sequence are bits in the $n/2^{th}$ column in the polar code butterfly diagram.

In other words, the target outer code sequence and a second outer code sequence are the same as a sequence obtained after outer code coding. A meaning that the target outer code sequence is the same as the sequence obtained after outer code coding is as follows. The target outer code sequence is equivalent to "the sequence obtained after outer code coding is performed on a target to-be-coded sequence".

In a solution, the obtaining the second outer code sequence based on the first outer code sequence and the plurality of first outer code codeword bits includes the following (1) to (3).

(1) Obtain a second outer code sequence whose length is N, where bits that are in the second outer code sequence and that correspond to the plurality of shaping bit positions are the plurality of first outer code codeword bits, and a bit other than the plurality of first outer code codeword bits in the second outer code sequence is a second preset bit.

The second preset bit may be 0. The first preset bit and the second preset bit may be the same or may be different.

(2) Perform system coding on the second outer code sequence to obtain a third outer code sequence whose length is N, where bits that are in the third outer code sequence and that correspond to the plurality of shaping bit positions are the plurality of first outer code codeword bits, a bit that is in the third outer code sequence and that corresponds to a position of a second frozen bit is a fourth outer code codeword bits, another bit in the third outer code sequence is the second preset bit, and the fourth outer code codeword bit is an outer code codeword bit corresponding to the position of the second frozen bit. In other words, the fourth outer code codeword bit is the same as a bit corresponding to the position of the second frozen bit after outer code coding. A meaning that the fourth outer code codeword bit is the same as the bit corresponding to the position of the second frozen bit after outer code coding is as follows. The fourth outer code codeword bit is equivalent to "a bit that is in the sequence obtained after outer code coding is performed on the target to-be-coded sequence and that corresponds to the position of the second frozen bit".

In a solution, a process of performing system coding on the second outer code sequence is as follows. If the second outer code sequence is denoted as $Z_o$, and the third outer code sequence is denoted as $Z_1$, $Z_1 = Z_2 \times G_i$, $Z_2$ is a bit sequence obtained after a bit that corresponds to a frozen bit and that is in $Z_2'$ is set as a frozen bit, and $Z_2' = Z_o \times G_i$.

In another solution, a process of performing system coding on the second outer code sequence is as follows. If the second outer code sequence is denoted as $Z_o$, and the third outer code sequence is denoted as $Z_1$, $Z_1=Z_2\times G_o$, $Z_2$ is a bit sequence obtained after a bit that corresponds to a frozen bit position and that is in $Z_2'$ is set as a frozen bit, and $Z_2'=Z_o\times G_o$.

For example, still refer to FIG. 6. The bits 635 and 636 are the first outer code codeword bits corresponding to the shaping bit positions. Bits 633 and 634 are obtained after system coding is performed based on the bits 635 and 636, where the bits 633 and 634 are fourth outer code codeword bits corresponding to positions of second frozen bits, as shown in a solid box 63.

In other words, the fourth outer code codeword bit corresponding to the position of the second frozen bit may be obtained by performing system coding on the second outer code sequence.

(3) Obtain the target outer code sequence based on the first outer code sequence and the third outer code sequence.

In a solution, a target outer code sequence Z is obtained by combining the first code sequence and the third outer code sequence, which may be represented by using the following formula: $Z=Z_1+X_o$. It may be understood that, in this solution, both the first preset bit and the second preset bit need to be 0.

In another solution, the second outer code codeword bit and the third outer code codeword bit in the first outer code sequence are extracted, the first outer code codeword bit and the fourth outer code codeword bit in the third outer code sequence are extracted, the second outer code codeword bit is placed at the information bit position, the third outer code codeword bit is placed at the corresponding position of the first frozen bit, the fourth outer code codeword bit is placed at the corresponding position of the second frozen bit, and the first outer code codeword bit is placed at the shaping bit position, to obtain the target outer code sequence.

For example, still refer to FIG. 6. Bits 621 to 636 obtained by using the foregoing examples, and the bits 621 to 636 form a target outer code sequence.

Step S505: Perform inner code coding on the target outer code sequence, to obtain and output a coded sequence.

A coded sequence X may be obtained by using the following formula: when $X_o=U\times G_i$, $X=Z\times G_0$, or when $X_o=U\times G_o$, $X=Z\times G_i$.

For example, still refer to FIG. 6. After a phase 3 and a phase 4 of a process of inner code coding is performed on a target outer code sequence that is formed from bits 621 to 636, a coded sequence $x_1, x_2, \ldots x_{16}$ is obtained and output.

In the method in this embodiment, polar decoding may be used to obtain, in parallel, a plurality of first outer code codeword bits corresponding to at least two shaping bit position groups, obtain, based on the plurality of first outer code codeword bits, an outer code sequence obtained after outer code coding, and then perform inner code coding on the outer code sequence to obtain and output a coded sequence, instead of first determining actual shaping bits by using a serial decoding method, to obtain the target to-be-coded sequence, and then performing polar coding on the target to-be-coded sequence to obtain and output the coded sequence. Therefore, PAS coding latency is greatly reduced.

The following uses a specific embodiment to describe a method for determining an information bit position, a frozen bit position, and a plurality of shaping bit positions in a first position sequence whose length is N.

FIG. 7 is a flowchart 2 of a coding method according to an embodiment of this application. Refer to FIG. 7, the method provided in this embodiment includes the following steps.

Step S701: Determine a first quantity of the shaping bits based on a code length, a quantity of information bits in a to-be-coded sequence, and a modulation order.

The modulation order in this embodiment may be any one of the following: 4, 16, 64, 128, or 256.

In a solution, determining the first quantity of the shaping bits based on the code length, a quantity of information bits in a to-be-coded sequence, and a modulation order may include the following a1 to a2.

a1: Obtain $\log_2 m$ quantities of estimated shaping bits based on the code length, the quantity of information bits in the to-be-coded sequence, and the modulation order, where m is the modulation order.

In the embodiment shown in FIG. 5, if the first position sequence includes $\log_2 m$ first sub-position sequences, each first sub-position sequence includes $$\left\lceil \frac{N}{\log_2 m} \right\rceil$$

positions, and $\log_2 m$ quantities of estimated shaping bits are in a one-to-one correspondence with the $\log_2 m$ first sub-position sequences, that is, a meaning of the $i^{th}$ quantity of estimated shaping bits is as follows. If a length of the $i^{th}$ first sub-position sequence is infinite, the $i^{th}$ quantity of estimated shaping bits is a quantity of shaping bit positions included in the $i^{th}$ first sub-position sequence, where $i=1, \ldots,$ and $\log_2 m$.

The obtaining $\log_2 m$ quantities of estimated shaping bits based on the code length, the quantity of information bits in the to-be-coded sequence, and the modulation order may be implemented by the following (a11) to (a12).

(a11) Determine a shaping target probability based on the code length, the quantity of information bits in the to-be-coded sequence, and the modulation order, where the $i^{th}$ component in the shaping target probability indicates a probability that the $i^{th}$ bit in each modulation symbol is 0.

$$\left\lceil \frac{N}{\log_2 m} \right\rceil$$

modulation symbols may be obtained after a coded sequence whose code length is N is modulated. Each modulation symbol includes $\log_2 m$ bits, and probabilities that the $i^{th}$ bit in each modulation symbol is 0 are the same. The $i^{th}$ component in the shaping target probability indicates a probability that the $i^{th}$ bit in each modulation symbol is 0, and the $i^{th}$ component corresponds to the $i^{th}$ first sub-position sequence, where $i=1, \ldots,$ and $\log_2 m$. For example, if the first component is equal to 0.5, it indicates that probabilities of an information bit position and a frozen bit position in the first sub-position sequence are equal, that is, both are 0.5. In other words, no shaping bit position is needed in the first sub-position sequence.

In a manner, the shaping target probability may be obtained by using the following formula 1:

$$\max_{p_1, p_2, \ldots, p_{\log_2 m}} I(X, Y)$$

In another manner, the shaping target probability is determined based on the code length, the quantity of information bits in the first position sequence, the modulation order, and a correspondence, where the correspondence includes preset shaping target probabilities respectively corresponding to a plurality of combinations, and each combination corresponds to a preset code length, a preset quantity of information bits, and a preset modulation order, or each combination corresponds to a preset code rate, a preset quantity of information bits, and a preset modulation order. The code rate is equal to a ratio of a quantity of information bits in a sequence to a code length of the sequence.

For example, the correspondence may be reflected by using a table, as shown in Table 1. In Table 1, $K_0$ indicates a preset quantity of information bits, R indicates a code rate, m indicates a modulation order, $p_1$ indicates a first component of a preset shaping target probability, and $p_2$ indicates a second component of a preset shaping target probability.

TABLE 1

| m = 4 | | | |
|---|---|---|---|
| K0 | R | $p_1$ | $p_2$ |
| 114^2 | 0.7932 | 0.5 | 0.29 |
| 115^2 | 0.8072 | 0.5 | 0.31 |
| 116^2 | 0.8213 | 0.5 | 0.34 |

(a12) For obtaining the $i^{th}$ quantity of estimated shaping bits: Determine the $i^{th}$ quantity of estimated shaping bits based on the probability that the $i^{th}$ bit in the modulation symbol is 0, the code length, and the modulation order.

In a manner, the $i^{th}$ quantity $S_i^*$ of estimated shaping bits may be obtained by using the following formula:

$$S_i^* = \frac{N(1 - H(p_i))}{\log_2 m},\quad \text{Formula 2}$$

where $$H(p_i) = -p_i \times \log_2(p_i) - (1-p_i) \& \log_2(1-p_i)$$

a2: Determine the first quantity of shaping bits based on $\log_2 m$ quantities of estimated shaping bits, the code length, and the quantity of information bits in the to-be-coded sequence.

In a solution, the determining the first quantity of shaping bits based on $\log_2 m$ quantities of estimated shaping bits, the code length, and the quantity of information bits in the to-be-coded sequence includes the following (a21) to (a22).

(a21) If each first sub-position sequence includes $$\left\lceil \frac{M_1}{\log_2 m} \right\rceil$$

segments, and each segment includes $M_2$ positions, obtain a quantity of segments including shaping bits in each first sub-position sequence.

For obtaining a quantity $L_i$ of segments including shaping bit positions in the $i^{th}$ first sub-position sequence, determine, based on the $i^{th}$ quantity of estimated shaping bits, the code length, and the quantity of information bits in the to-be-coded sequence, a quantity $L_i$ of segments including shaping bits in the $i^{th}$ first sub-position sequence, which may be implemented by using the following formula:

$$L_i = \max\left(\left\lceil \frac{S_i^*}{\sqrt{K + \sum S_i^*}} \right\rceil - l,\ 0\right).\quad \text{Formula 3}$$

l indicates a performance loss introduced by a code length, and may be configured according to the following empirical criteria:

$$l = \begin{cases} 1, & n > 16 \\ 2, & 6 < n \le 16 \\ 3, & n \le 6 \end{cases}$$

(a22) Determine the first quantity of the shaping bits based on a quantity of segments including shaping bits in the first sub-position sequence and the quantity of information bits in the to-be-coded sequence.

For example, the first quantity S of shaping bits is obtained by using the following formula:

$$\min_S \left\lfloor \sqrt{K+S} \right\rfloor \sum L_i = S.\quad \text{Formula 4}$$

For example, if N=16384, K=13225, and m=4, a shaping target probability $[p_1, p_2]$=[0.5, 0.31] is obtained according to Formula 1. $S_1^*$=0 and $S_2^*$=875 are obtained according to Formula 2. $L_1$=0 and $L_2$=5 are obtained according to Formula 3. S=585 is obtained according to Formula 4. As described above, the first position sequence includes two first sub-position sequences, the first first sub-position sequence does not include a shaping bit position, and the second sub-position sequence includes 585 shaping bit positions, that is, 585 shaping bits need to be set.

Step S702: Determine an information bit position, a frozen shaping bit position, and shaping bit positions of the first quantity in the first position sequence based on the first quantity of shaping bits, the code length, and the quantity of information bits in the to-be-coded sequence.

In a solution, the determining the shaping bit positions of the first quantity in the first position sequence based on the first quantity of shaping bits, the code length, and the quantity of information bits in the to-be-coded sequence may include (c1) to (c2) as follows.

c1: Determine a second position sequence based on the first quantity, the code length N, and the quantity of information bits in the to-be-coded sequence, where the second position sequence includes K+S information bit positions and N−(K+S) frozen bit positions.

In a solution, the determining the second position sequence based on the first quantity, the code length, and the quantity of information bits in the to-be-coded sequence may include the following (c11) to (c12).

(c11) Obtain a third position sequence whose length is N based on the first quantity, the code length N, and the quantity of information bits in the to-be-coded sequence, where the third position sequence includes K* information bit positions, and $K^* = (\lceil \sqrt{K+S} \rceil)^2$.

In a specific implementation, a method for obtaining the third position sequence may be as follows. A preselected position sequence (where the preselected position sequence is also referred to as an indicating vector) whose parameter is $(\sqrt{N}, \lceil \sqrt{K+S} \rceil)$ is constructed by using a method such as GA or PW. The preselected position sequence of the parameter $(\sqrt{N}, \lceil \sqrt{K+S} \rceil)$ means that $\lceil \sqrt{K+S} \rceil$ information bit positions are included in the preselected position sequence. For example, if an element 1 indicates an information bit position, and an element 0 indicates a frozen bit position, the preselected position sequence includes 0 and 1, where a quantity of 0 is $\sqrt{N}-\lceil\sqrt{K+S}\rceil$, and a quantity of 1 is $\lceil\sqrt{K+S}\rceil$.

A third position sequence whose length is N is obtained by performing kronecker operation on the preselected position sequence, where the third position sequence includes K* information bit positions, and $K^*=(\lceil\sqrt{K+S}\rceil)^2$.

For example, N=16, K=9, and a preselected position sequence whose length is (4,3) is constructed by using a method such as GA or PW, and the preselected position sequence is [0 1 1 1]. A position at which 1 is located is an information bit position, and a position at which 0 is located is a frozen bit position. A third position sequence [0 0 0 0 1 1 1 0 1 1 1 0 1 1 1] is obtained through calculation: [0 1 1 1]⊗[0 1 1 1].

(c12) If K* is greater than K+S, update K*−(K+S) information bit positions in K* information bit positions to frozen bit positions, to obtain the second position sequence that includes K+S information bit positions.

In a specific implementation, the updating K*−(K+S) information bit positions in K* information bit positions to frozen bit positions, to obtain the second position sequence that includes K+S information bit positions includes c121 to c122 as follows.

c121: Convert the third position sequence into a matrix form, where a size of the matrix is $M_2 \times M_1$. An element in the $k^{th}$ row of the $l^{th}$ column is the $(l-1)M_2+k_{th}$ position in the third position sequence, where l=1, . . . , and $M_1$, k=1, . . . , and $M_2$. The first column is the first, second, . . . , and $M_{2^{th}}$ the positions in the third position sequence. The second column is the $M_2+2^{th}$, $M_2\pm2^{th}$, and the $2M_{2^{th}}$ positions in the third position sequence. The last column is the $(M_1-1)M_2+1_{th}$, the $(M_1-1)M_2+2_{th}$, . . . , and the $N^{th}$ positions in the third position sequence.

It may be understood that, when $M_2=M_1=\sqrt{N}$, the matrix is a matrix with $\lceil\sqrt{N}\rceil$ rows and $\lceil\sqrt{N}\rceil$ columns. The first column is the first, second, . . . , and the $\lceil\sqrt{N}\rceil_{th}$ positions in the third position sequence. The second column is the $\lceil\sqrt{N}\rceil+1^{th}$, $\lceil\sqrt{N}\rceil+2^{th}$, . . . , and the $2\lceil\sqrt{N}\rceil^{th}$ positions in the third position sequence. The last column is the $(\lceil\sqrt{N}\rceil-1)\lceil\sqrt{N}\rceil+1_{th}$, the $(\lceil\sqrt{N}\rceil-1)\lceil\sqrt{N}\rceil+2_{th}$, . . . , and the $N^{th}$ positions in the third position sequence.

For example, after converted into a matrix form, the third position sequence [0 0 0 0 1 1 1 0 1 1 1 0 1 1 1] may be $$\begin{bmatrix} 0 & 0 & 0 & 0 \\ 0 & 1 & 1 & 1 \\ 0 & 1 & 1 & 1 \\ 0 & 1 & 1 & 1 \end{bmatrix}.$$

c122: Sequentially update $$\frac{K^*-(K+S)}{2}$$

information bit positions from right to left in a target row in the matrix to frozen bit positions, to obtain a first matrix; and sequentially update $$\frac{K^*-(K+S)}{2}$$

information bit positions from bottom to top in a target column in the first matrix to frozen bit positions, to obtain a new matrix. In other words, if a position at which 1 is placed in the third position sequence is an information bit position, and a position at which 0 is placed is a frozen bit position, c122 is equivalent to sequentially updating 1 in the target row in a matrix converted from the third position sequence to 0 from right to left, to obtain a first matrix, where a quantity of 1 is $$\frac{K^*-(K+S)}{2},$$

and sequentially updating 1 in a target column in the first matrix to 0 from bottom to top, to obtain a new matrix, where a quantity of 0 is $$\frac{K^*-(K+S)}{2}.$$

The new matrix is the second position sequence.

If an information bit position whose reliability is $\lceil\sqrt{K^*}\rceil$ in the preselected position sequence is the $f^{th}$ position in the preselected position sequence, the target row is the $f^{th}$ row of the matrix converted from the third position sequence, and the target column is the $f^{th}$ column of the first matrix. In other words, if the reliability of the $f^{th}$ position in the preselected position sequence is low, an information bit position with low reliability is updated to a frozen bit position, so that a probability that the information bit is correctly coded and correctly transmitted can be improved.

It may be understood that if K* is equal to K+S, the matrix converted from the third position sequence is used as the second position sequence.

c2: Determine S shaping bit positions from K+S information bit positions based on the code length and the quantity of information bits in the to-be-coded sequence, to obtain the first position sequence. That is, the information bit positions, the frozen shaping bit positions, and the shaping bit positions of the first quantity in the first position sequence are determined.

The second position sequence is divided into $\log_2 m$ second sub-position sequences. $L_i$ information bit positions with the first $L_i$ reliability in a position sequence whose length is $$\left\lceil\frac{M_1}{\log_2 m}\right\rceil$$

are determined, and $S_i$ information bit positions included in $L_i$ target segments in the $i^{th}$ second sub-position sequence are updated to $S_i$ shaping bit positions, to obtain the first position sequence, where $L_i$ information bit positions indicate $L_i$ target segments, $L_i$ is an integer, i=1, . . . , and $\log_2 m$, and $$\sum_{i=1}^{\log_2 m} S_i = S.$$

For example, if $L_i$ information bit positions include the $a^{th}$ position and the $b^{th}$ in a position sequence whose length is $$\left\lceil \frac{M_1}{\log_2 m} \right\rceil,$$

$S_i$ information bit positions included in the $a^{th}$ segment and the $b^{th}$ segment in the second sub-position sequence are updated to $S_i$ shaping bit positions.

In a specific implementation, if K* is equal to K+S, the matrix (the second position sequence) converted from the third position sequence is divided into $\log_2 m$ submatrices, and a submatrix $C_i$ includes the $$(i-1)\left\lceil \frac{M_1}{\log_2 m} \right\rceil + 1_{th}$$

column, the $$(i-1)\left\lceil \frac{M_1}{\log_2 m} \right\rceil + 2_{th}$$

column, . . . , and the $$(i-1)\left\lceil \frac{M_1}{\log_2 m} \right\rceil + \left\lceil \frac{M_1}{\log_2 m} \right\rceil_{th}$$

column in the matrix. The submatrix $C_i$ is the $i^{th}$ second sub-position sequence, a column in the submatrix $C_i$ is a segment included in the second sub-position sequence. That is, the second sub-position sequence includes $$\left\lceil \frac{M_1}{\log_2 m} \right\rceil$$

segments, and each segment includes $M_2$ positions.

Value of i is sequentially set to 1, . . . , and $\log_2 m$. The following operation is $L_i$ performed to obtain a second matrix: determining $L_i$ information bit positions with the first $L_i$ reliability in a position sequence whose length is $$\left\lceil \frac{M_1}{\log_2 m} \right\rceil,$$

and updating $S_i$ information bit positions included in $L_i$ columns corresponding to $L_i$ information bit positions in a submatrix $C_i$ to $S_i$ shaping bit positions. The second matrix is restored to a position sequence of one row and N column, to obtain the first position sequence. In other words, a quantity of segments that include shaping bit positions in the $i^{th}$ first sub-position sequence in the first position sequence is $L_i$.

For example, if N=16384, K=13225, and m=4, as described above, S=585 shaping bit positions are required, and $L_1$=0 and $L_2$=5. A third position sequence whose length is 13225 is obtained based on S, N, and K, where the third position sequence includes K*=13810 information bit positions. The third position sequence is written into a 128×128 matrix, where the first column of the matrix is the first to $128^{th}$ positions in the third position sequence, the second column is the $129^{th}$ to $256^{th}$ positions in the third position sequence. The first column of the matrix is the first to $128^{th}$ positions in the third position sequence, the second column is the $129^{th}$ to $256^{th}$ positions in the third position sequence, . . . , and the last column is the $16257^{th}$ to $16384^{th}$ positions in the third position sequence.

Figure 8:
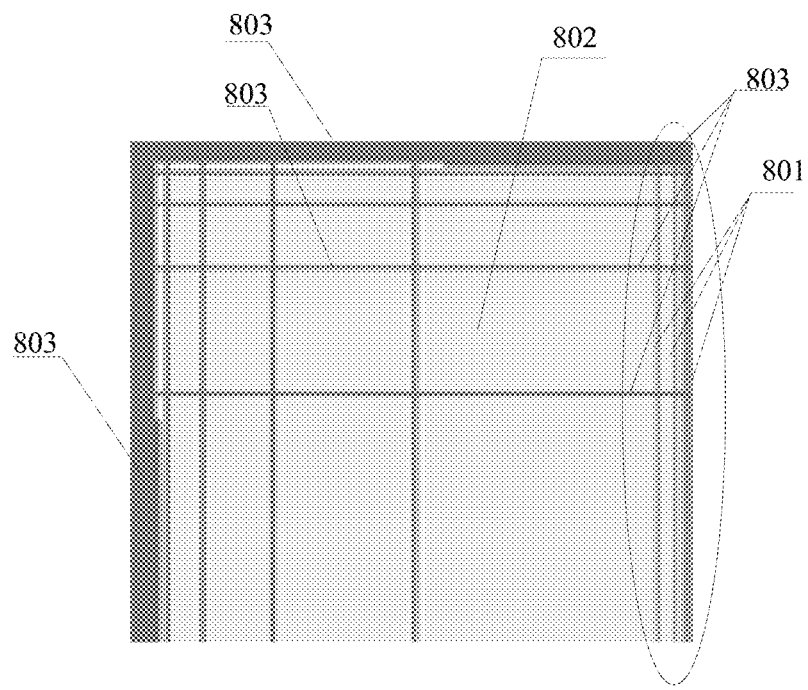
FIG. 8 is a schematic diagram of a position sequence according to an embodiment of this application.

Because K* is equal to K+S, the matrix is divided into two submatrices. The first submatrix includes the first 64 columns of a first position matrix, and the second submatrix includes the last 64 columns of the first position matrix. Five information bit positions with reliability ranked top five in the position sequence whose length is 64 are determined, and information bit positions included in columns corresponding to the five information bit positions in the second submatrix are updated to shaping bit positions. Details may be shown in FIG. 8. Refer to FIG. 8. In FIG. 8, five columns with gray shadows framed by ellipses are shaping bit positions 801, a lightest-colored position is information bit position 802, and other positions are frozen bit positions 803.

When corresponding to the polar code butterfly diagram in FIG. 1, the 585 shaping bit positions form 117 shaping bit position groups, every five shaping bit positions form one shaping bit position group, and bits corresponding to the 585 shaping bit positions after polar coding belong to 117 subcodes of inner code.

When corresponding to the polar code butterfly diagram in FIG. 2, the 585 shaping bit positions form five shaping bit position groups, every 117 shaping bit positions form one shaping bit position group, and bits corresponding to the 585 shaping bit positions after polar coding belong to five subcodes of inner code.

This embodiment provides specific implementation of the method for determining an information bit position, a frozen bit position, and a plurality of shaping bit positions in a first position sequence whose length is N. The determined plurality of shaping bit positions may reduce coding latency of a to-be-coded sequence in a coding process.

The coding method in this application is described by using the foregoing embodiments. It may be understood that, after a coded sequence is obtained through coding, the coded sequence may be modulated, and then a modulated signal may be sent to a receiving device. The receiving device demodulates the modulated signal after receiving the modulated signal, and decodes a demodulated sequence. For a decoding method, refer to a current universal polar decoding method.

Figure 9:
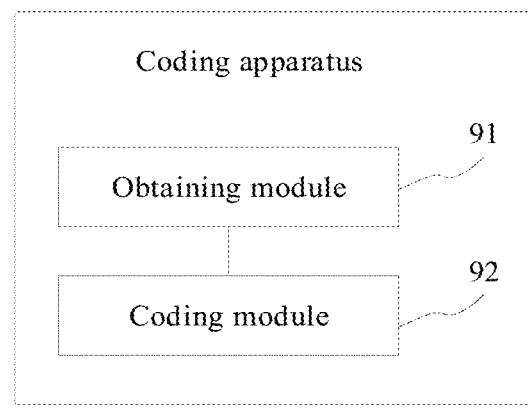
FIG. 9 is a schematic diagram of a structure of a coding apparatus according to an embodiment of this application.

FIG. 9 is a schematic diagram of a structure of a coding apparatus according to an embodiment of this application. Refer to FIG. 9, the coding modulating apparatus may include an obtaining module 91 and a coding module 92.

The obtaining module 91 is configured to obtain a to-be-coded sequence whose length is N, where the to-be-coded sequence is obtained after an information bit is placed at an information bit position, a frozen bit is placed at a frozen bit position, and first preset bits are placed at a plurality of shaping bit positions in a first position sequence, bits corresponding to the plurality of shaping bit positions after polar coding belong to a plurality of different subcodes of inner code, and shaping bit positions whose corresponding bits after polar coding belong to a same subcode of inner code belong to a same group of shaping bit positions.

The coding module 92 is configured to perform outer code coding on the to-be-coded sequence, to obtain a first outer code sequence whose length is N.

The coding module 92 is further configured to obtain, in parallel based on the first outer code sequence, a plurality of first outer code codeword bits corresponding to a plurality of groups of shaping bit positions, and the plurality of first outer code codeword bits are the same as the bits corresponding to the plurality of shaping bit positions after outer code coding.

The coding module 92 is further configured to obtain a target outer code sequence based on the first outer code sequence and the plurality of first outer code codeword bits, and the target outer code sequence is the same as a sequence obtained after outer code coding.

The coding module 92 is further configured to perform inner code coding on the target outer code sequence, to obtain and output a coded sequence.

Optionally, the first outer code sequence includes a second outer code codeword bit corresponding to an information bit position obtained after outer code coding and a third outer code codeword bit corresponding to a first frozen bit position obtained after outer code coding, where generation of the third outer code codeword bit is not related to the bits at the plurality of shaping bit positions.

The coding module 92 is specifically configured to:
obtain, based on one or more outer code codeword bits in the second outer code codeword bits and/or the third outer code codeword bits, the first outer code codeword bit corresponding to the first shaping bit position group by using polar decoding, where the first outer code codeword bit corresponding to the first shaping bit position group is the same as a bit corresponding to a first shaping bit position obtained after outer code coding, a bit corresponding to the first shaping bit position group after polar coding and a bit corresponding to a target position belong to a same subcode of inner code, and a bit corresponding to the target position after outer code coding is a target outer code codeword bit.

Optionally, before the coding module 92 obtains the first target outer code codeword bit based on the target outer code codeword bit by using polar decoding, the coding module 92 is further configured to:
determine a first length $$\left\lceil \frac{M_1}{\log_2 m} \right\rceil$$

based on N, a modulation order, and a signal-to-noise ratio, where the first position sequence includes $\log_2 m$ first sub-position sequences, the first sub-position sequences include $$\left\lceil \frac{M_1}{\log_2 m} \right\rceil$$

segments, each segment includes $M_2$ positions, $M_1 \times M_2 = N$, m is the modulation order, and $M_1$ and $M_2$ both are positive integers; and
determine a polar code of the first length.

That the coding module obtains the first outer code codeword bit corresponding to the first shaping bit position group based on the target outer code codeword bit by using polar decoding includes:
performing first order decoding on the polar code of the first length based on the target outer code codeword bit, to obtain the first outer code codeword bit corresponding to the first shaping bit position group.

Optionally, the coding module 92 is specifically configured to:
obtain a second outer code sequence whose length is N, where bits that are in the second outer code sequence and that correspond to the plurality of shaping bit positions are the plurality of first outer code codeword bits, and a bit other than the plurality of first outer code codeword bits in the second outer code sequence is a second preset bit;
perform system coding on the second outer code sequence to obtain a third outer code sequence whose length is N, where bits that are in the third outer code sequence and that correspond to the plurality of shaping bit positions are the plurality of first outer code codeword bits, a bit that are in the third outer code sequence and that corresponds to a position of a second frozen bit is a fourth outer code codeword bits, another bit in the third outer code sequence is the second preset bit, the fourth outer code codeword bit is the same as a bit corresponding to the position of the second frozen bit obtained after outer code coding, and the second frozen bit is a frozen bit other than the first frozen bit in the to-be-coded sequence; and obtain the target outer code sequence based on the first outer code sequence and the third outer code sequence.

Optionally, before the obtaining module 91 obtains the to-be-coded sequence whose length is N, the obtaining module 91 is further configured to:
determine a first quantity of the shaping bits based on N, a quantity of information bits in the to-be-coded sequence, and the modulation order; and
determine the information bit position, a frozen shaping bit position, and shaping bit positions of the first quantity in the first position sequence based on the first quantity, N, and the quantity of information bits.

Optionally, the obtaining module 91 is specifically configured to:
determine a second position sequence based on the first quantity, N, and the quantity of information bits, where the second position sequence includes K+S information bit positions and N−(K+S) frozen bit positions, K is the quantity of information bits, and S is the first quantity; and
determine S shaping bit positions from K+S information bit positions in the second position sequence based on N and the quantity of information bits in the to-be-coded sequence, to obtain the first position sequence.

Optionally, the obtaining module 91 is specifically configured to:
obtain a third position sequence whose length is N based on the first quantity, N, and the quantity of information bits, where the third position sequence includes K* information bit positions, and $K^* = (\lceil \sqrt{K+S} \rceil)^2$; and
if K* is greater than K+S, update K*−(K+S) information bit positions in K* information bit positions to frozen bit positions, to obtain the second position sequence.

Optionally, the second position sequence includes $\log_2 m$ second sub-position sequences, the second sub-position sequences include $$\left\lceil \frac{M_1}{\log_2 m} \right\rceil$$

segments, each segment includes $M_2$ positions, m is the modulation order, $M_1 \times M_2 = N$, and both $M_1$ and $M_2$ are positive integers.

That the obtaining module 91 determines S shaping bit positions from K+S information bit positions in the second position sequence based on N and the quantity of information bits in the to-be-coded sequence, to obtain the first position sequence includes:

for the $i^{th}$ sub-position sequence in $\log_2 m$ second sub-position sequences, determining $L_i$ information bit positions with the first $L_i$ reliability in a position sequence whose length is $$\left\lceil \frac{M_1}{\log_2 m} \right\rceil,$$

and updating $S_i$ information bit positions included in $L_i$ target segments in the $i^{th}$ second sub-position sequence to $S_i$ shaping bit positions, to obtain the first position sequence, where $L_i$ information bit positions indicate $L_i$ target segments, $L_i$ is an integer, i=1, ..., and $\log_2 m$, and $$\sum_{i=1}^{\log_2 m} S_i = S.$$

$L_i$ is obtained based on the $i^{th}$ quantity of estimated shaping bits in $\log_2 m$ quantities of estimated shaping bits, N, and the quantity of information bits. $\log_2 m$ quantities of estimated shaping bits are obtained based on N, the quantity of information bits in the to-be-coded sequence, and the modulation order. $\log_2 m$ quantities of estimated shaping bits are used to determine the first quantity.

Optionally, the obtaining module 91 is specifically configured to:

obtain $\log_2 m$ quantities of estimated shaping bits based on N, the quantity of information bits in the to-be-coded sequence, and the modulation order, where m is the modulation order; and determine the first quantity of shaping bits based on $\log_2 m$ quantities of estimated shaping bits, N, and the quantity of information bits.

Optionally, the obtaining module 91 is specifically configured to:

determine a shaping target probability based on N, the quantity of information bits, and the modulation order, where the $i^{th}$ component in the shaping target probability indicates a probability that the $i^{th}$ bit in each modulation symbol is 0; and determine the $i^{th}$ quantity of estimated shaping bits based on the probability that the $i^{th}$ bit in the modulation symbol is 0, N, and the modulation order.

Optionally, the obtaining module 91 is specifically configured to:

determine the shaping target probability based on N, a quantity of information bits in the first position sequence, the modulation order, and a correspondence, where the correspondence includes preset shaping target probabilities respectively corresponding to a plurality of combinations, and each combination corresponds to a preset code length, a preset quantity of information bits, and a preset modulation order, or each combination corresponds to a preset code rate, a preset quantity of information bits, and a preset modulation order.

Optionally, the obtaining module 91 is specifically configured to:

determine $\log_2 m$ quantities of shaping bit segments based on $\log_2 m$ quantities of estimated shaping bits, N, and the quantity of information bits, where the $i^{th}$ quantity $L_i$ of shaping bit segments is obtained based on the $i^{th}$ quantity of estimated shaping bits in $\log_2 m$ quantities of estimated shaping bits, N, and the quantity of information bits, the $i^{th}$ quantity $L_i$ of shaping bit segments is a quantity of segments that are in the $i^{th}$ first sub-position sequence and that include shaping bits, the first position sequence includes $$\left\lceil \frac{M_1}{\log_2 m} \right\rceil$$

segments, each segment includes $M_2$ positions, and i=1, ..., and $\log_2 m$; and determine the first quantity of shaping bits based on $\log_2 m$ quantities of shaping bit segments and the quantity of information bits.

The coding apparatus provided in this embodiment of this application may implement the technical solutions shown in the foregoing method embodiments. Implementation principles and beneficial effects thereof are similar to the method embodiments. Details are not described herein again.

Figure 10:
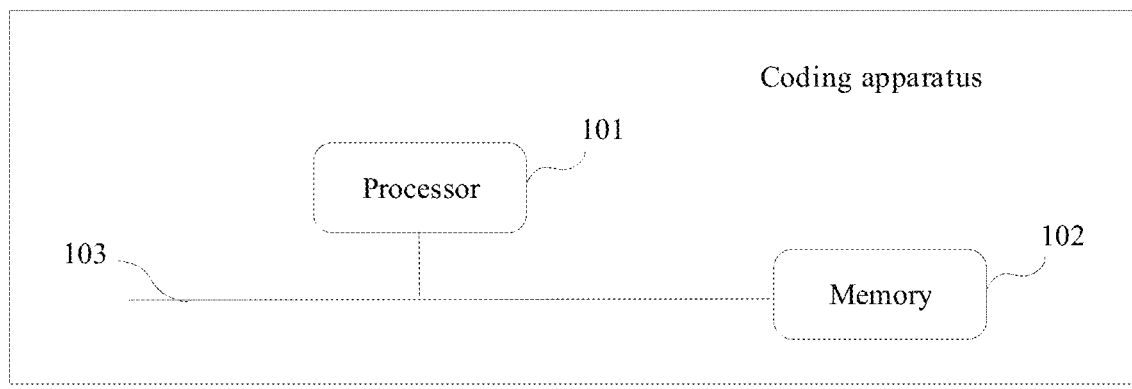
FIG. 10 is a schematic diagram of a hardware structure of a coding apparatus according to an embodiment of this application.

FIG. 10 is a schematic diagram of a hardware structure of a coding apparatus according to an embodiment of this application. Refer to FIG. 10. The coding apparatus may include a processor 101 and a memory 102.

The memory 102 is configured to store a computer program, and sometimes is further configured to store intermediate data.

The processor 101 is configured to execute the computer program stored in the memory, to implement steps in the foregoing coding method. For details, refer to related descriptions in the foregoing method embodiments.

Optionally, the memory 101 may be independent, or may be integrated with the processor 101. In some implementations, the memory 102 may even be located outside the coding apparatus.

When the memory 102 is a component independent of the processor 101, the coding apparatus may further include a bus 103, configured to connect the memory 102 and the processor 101.

Optionally, the coding apparatus may further include a receiver and a transmitter. For example, the receiver is configured to obtain to-be-coded bits, and the transmitter may be configured to output a modulated symbol sequence.

The coding apparatus provided in this embodiment may be a terminal device or a network device, and may be configured to perform the foregoing coding methods. Implementations and technical effects thereof are similar to those of the coding methods. Details are not described herein again in this embodiment.

Figure 11:
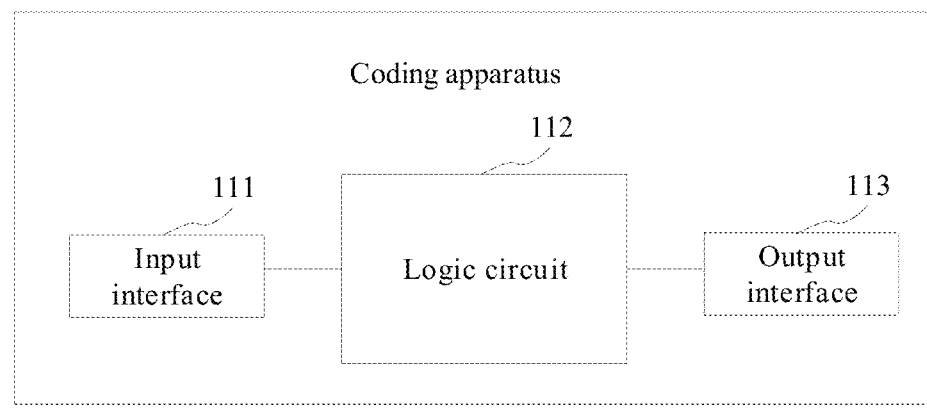
FIG. 11 is another schematic diagram of a structure of a coding apparatus according to an embodiment of this application.

FIG. 11 is another schematic diagram of a structure of a coding apparatus according to an embodiment of this application. Refer to FIG. 11. The coding apparatus 110 may include an input interface 111, a logic circuit 112, and an output interface 113.

The input interface 111 is configured to obtain information bits.

The logic circuit 112 is configured to implement steps in the foregoing coding method based on the information bits, to obtain a coded sequence.

The output interface 113 is configured to output the coded sequence.

Optionally, the logic circuit 112 has functions of the coding module 92 and the obtaining module 91 in FIG. 9.

Optionally, the input interface 111 may have a function of the receiver in the embodiment shown in FIG. 10. The logic circuit 112 may have a function of the processor 101 in the embodiment shown in FIG. 10. The output interface 113 may have a function of the transmitter in the embodiment shown in FIG. 10.

The code modulating apparatus 110 provided in this embodiment of this application can perform the technical solutions shown in the foregoing method embodiments. Implementation principles and beneficial effects are similar. Details are not described herein again.

An embodiment of this application may further provide a storage medium. The storage medium includes a computer program, and the computer program is used to implement the foregoing coding method.

An embodiment of this application further provides a chip or an integrated circuit, including a memory and a processor.

The memory is configured to store program instructions, and sometimes is further configured to store intermediate data.

The processor is configured to invoke the program instructions stored in the memory, to perform the foregoing coding method.

Optionally, the memory may be independent, or may be integrated with the processor. In some implementations, the memory may alternatively be located outside the chip or the integrated circuit.

An embodiment of this application further provides a program product. The program product includes a computer program, the computer program is stored in a storage medium, and the computer program is used to perform the foregoing coding method.

Methods or algorithm steps described with reference to content disclosed in embodiments of the present invention may be implemented by hardware, or may be implemented by a processor by executing software instructions. The software instructions may include a corresponding software module. The software module may be stored in a random access memory (RAM), a flash memory, a read-only memory (ROM), an erasable programmable read only memory (Erasable Programmable ROM, EPROM), an electrically erasable programmable read only memory (Electrically EPROM, EEPROM), a register, a hard disk, a removable hard disk, a compact disc read-only memory (CD-ROM), or any other form of storage medium well-known in the art. For example, a storage medium is coupled to a processor, so that the processor can read information from the storage medium and write information into the storage medium. Certainly, the storage medium may be a component of the processor. The processor and the storage medium may be disposed in an ASIC. In addition, the ASIC may be located in a base station or a terminal. Certainly, the processor and the storage medium may exist in a receiving device as discrete components.

It should be understood that the processor may be a central processing unit (CPU), or may be another general-purpose processor, a digital signal processor (DSP), an application-specific integrated circuit (ASIC), or the like. The general-purpose processor may be a microprocessor, or the processor may be any conventional processor or the like. The steps of the methods disclosed with reference to the present invention may be directly implemented by a hardware processor, or may be implemented by a combination of hardware and a software module in a processor.

The memory may include a high-speed RAM memory, or may include a non-volatile memory NVM such as at least one magnetic disk memory, or may include a USB flash drive, a removable hard disk, a read-only memory, a magnetic disk, an optical disc, or the like.

The bus may be an industry standard architecture (ISA) bus, a peripheral component interconnect (Peripheral Component, PCI) bus, an extended industry standard architecture (EISA) bus, or the like. Buses may be classified into an address bus, a data bus, a control bus, or the like. For ease of representation, the bus in the accompanying drawings in this application is not limited to only one bus or only one type of bus.

The storage medium may be implemented by any type of volatile or non-volatile storage device or a combination thereof, for example, a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk, or an optical disc. The storage medium may be any available medium accessible to a general-purpose or a dedicated computer.

In this application, "at least one" means one or more, and "a plurality of" means two or more. The term "and/or" describes an association relationship for describing associated objects and represents that three relationships may exist. For example, A and/or B may represent the following cases: Only A exists, both A and B exist, and only B exists, where A and B may be singular or plural. The character "/" usually indicates an "or" relationship between associated objects. "At least one of the following items (pieces)" or a similar expression thereof refers to any combination of these items, including any combination of singular item (piece) or plural items (pieces). For example, at least one item (piece) of a, b, and c may indicate: a, b, c, a and b, a and c, b and c, or a, b, and c, where a, b, and c may be singular or plural.

A person skilled in the art should be aware that in the foregoing one or more examples, functions described in embodiments of the present invention may be implemented by hardware, software, firmware, or any combination thereof. When the functions are implemented by software, the foregoing functions may be stored in a computer-readable medium or transmitted as one or more instructions or code in a computer-readable medium. The computer-readable medium includes a computer storage medium and a communication medium. The communication medium includes any medium that facilitates transmission of a computer program from one place to another. The storage medium may be any available medium accessible to a general-purpose or a dedicated computer.

In several embodiments provided in the present invention, it should be understood that the disclosed device and method may be implemented in other manners. For example, the described device embodiments are merely an example. For example, division into the modules is merely logical function division and may have another manner for division during actual implementation. For example, a plurality of modules may be combined or integrated into another system, or some features may be ignored or not performed. In addition, displayed or discussed mutual couplings or direct couplings or communication connections may be implemented through some interfaces. Indirect couplings or communication connections between apparatuses or modules may be implemented in electronic, mechanical, or other forms.

The modules described as separate components may or may not be physically separate. Components displayed as modules may or may not be physical units, may be located in one position, or may be distributed on a plurality of network units. Some or all modules may be selected based on an actual requirement to achieve the objectives of the solutions of embodiments.

In addition, functional modules in embodiments of the present invention may be integrated into one processing unit, or each of the modules may physically and separately exist, or two or more modules are integrated into one unit. The unit formed by the modules may be implemented in a form of hardware, or may be implemented in a form of hardware and a software functional unit.

What is claimed is:

1. A coding method applied to a coding apparatus, the method comprising:
   obtaining a to-be-coded sequence whose length is N, wherein the to-be-coded sequence is obtained after an information bit is placed at an information bit position, a frozen bit is placed at a frozen bit position, and first preset bits are placed at a plurality of shaping bit positions in a first position sequence, wherein bits associated with the plurality of shaping bit positions after polar coding belong to a plurality of different subcodes of inner code, and wherein shaping bit positions whose associated bits after polar coding belong to a same subcode of inner code belong to a same group of shaping bit positions;
   performing outer code coding on the to-be-coded sequence to obtain a first outer code sequence whose length is N;
   obtaining, in parallel based on the first outer code sequence, a plurality of first outer code codeword bits associated with a plurality of groups of shaping bit positions, wherein the plurality of first outer code codeword bits is the same as the bits associated with the plurality of shaping bit positions after outer code coding;
   obtaining a target outer code sequence based on the first outer code sequence and the plurality of first outer code codeword bits, wherein the target outer code sequence is the same as a sequence obtained after outer code coding; and
   performing inner code coding on the target outer code sequence to obtain and output a coded sequence.

2. The method according to claim 1, wherein the first outer code sequence comprises a second outer code codeword bit associated with an information bit position obtained after outer code coding and a third outer code codeword bit associated with a first frozen bit position obtained after outer code coding and, wherein generation of the third outer code codeword bit is not related to the bits at the plurality of shaping bit positions; and
   wherein obtaining the first outer code codeword bit associated with any first shaping bit position group in the plurality of groups of shaping bit positions comprises:
      obtaining, based on one or more outer code codeword bits in the second outer code codeword bits and/or the third outer code codeword bits, the first outer code codeword bit associated with the first shaping bit position group by using polar decoding, wherein the first outer code codeword bit associated with the first shaping bit position group is the same as a bit associated with a first shaping bit position obtained after outer code coding,
      wherein a bit associated with the first shaping bit position group after polar coding and a bit associated with a target position belong to a same subcode of inner code, and
      wherein a bit associated with the target position after outer code coding is a target outer code codeword bit.

3. The method according to claim 2, wherein before obtaining the first target outer code codeword bit based on the target outer code codeword bit by using polar decoding, the method further comprises:
   determining a first length $$\left\lceil \frac{M_1}{\log_2 m} \right\rceil$$

based on N, a modulation order, and a signal-to-noise ratio, wherein the first position sequence comprises $\log_2 m$ first sub-position sequences, the first sub-position sequences comprise $$\left\lceil \frac{M_1}{\log_2 m} \right\rceil$$

segments, each segment comprises $M_2$ positions, $M_1 \times M_2 = N$, m is the modulation order, and $M_1$ and $M_2$ both are positive integers;
   determining a polar code of the first length; and
   wherein obtaining the first outer code codeword bit associated with the first shaping bit position group based on the target outer code codeword bit by using polar decoding comprises:
      performing first order decoding on the polar code of the first length based on the target outer code codeword bit to obtain the first outer code codeword bit associated with the first shaping bit position group.

4. The method according to claim 1, wherein obtaining the target outer code sequence based on the first outer code sequence and the plurality of first outer code codeword bits comprises:
   obtaining a second outer code sequence whose length is N, wherein bits that are in the second outer code sequence and that correspond to the plurality of shaping bit positions are the plurality of first outer code codeword bits, and a bit other than the plurality of first outer code codeword bits in the second outer code sequence is a second preset bit;
   performing system coding on the second outer code sequence to obtain a third outer code sequence whose length is N,
      wherein bits that are in the third outer code sequence and that correspond to the plurality of shaping bit positions are the plurality of first outer code codeword bits,
      wherein a bit in the third outer code sequence that corresponds to a position of a second frozen bit is a fourth outer code codeword bit, another bit in the third outer code sequence is the second preset bit,
      wherein the fourth outer code codeword bit is the same as a bit associated with the position of the second frozen bit obtained after outer code coding, and wherein the second frozen bit is a frozen bit other than the first frozen bit in the to-be-coded sequence; and obtaining the target outer code sequence based on the first outer code sequence and the third outer code sequence.

5. The method according to claim 1, wherein before obtaining the to-be-coded sequence whose length is N, the method further comprises:

determining a first quantity of the shaping bits based on N, a quantity of information bits in the to-be-coded sequence, and the modulation order; and determining the information bit position, a frozen shaping bit position, and shaping bit positions of the first quantity in the first position sequence based on the first quantity, N, and the quantity of information bits.

6. The method according to claim 5, wherein determining the information bit position, the frozen shaping bit position, and shaping bit positions of the first quantity in the first position sequence based on the first quantity, N, and the quantity of information bits comprises:

determining a second position sequence based on the first quantity, N, and the quantity of information bits, wherein the second position sequence comprises K+S information bit positions and N−(K+S) frozen bit positions, K is the quantity of information bits, and S is the first quantity; and determining S shaping bit positions from K+S information bit positions in the second position sequence based on N and the quantity of information bits in the to-be-coded sequence, to obtain the first position sequence.

7. The method according to claim 6, wherein determining the second position sequence based on the first quantity, N, and the quantity of information bits comprises:

obtaining a third position sequence whose length is N based on the first quantity, N, and the quantity of information bits, wherein the third position sequence comprises K* information bit positions, and K*=($\lceil \sqrt{K+S} \rceil$)²; and in response to K* being greater than K+S, updating K*−(K+S) information bit positions in K* information bit positions to frozen bit positions to obtain the second position sequence.

8. The method according to claim 6, wherein the second position sequence comprises $\log_2 m$ second sub-position sequences, the second sub-position sequences comprise $$\left\lceil \frac{M_1}{\log_2 m} \right\rceil$$

segments, each segment comprises $M_2$ positions, m is the modulation order, $M_1 \times M_2 = N$, and both $M_1$ and $M_2$ are positive integers; and determining S shaping bit positions from K+S information bit positions in the second position sequence based on N and the quantity of information bits in the to-be-coded sequence, to obtain the first position sequence comprises:

for the $i^{th}$ sub-position sequence in $\log_2 m$ second sub-position sequences, determining $L_i$ information bit positions with the first $L_i$ reliability in a position sequence whose length is $$\left\lceil \frac{M_1}{\log_2 m} \right\rceil;$$

and updating $S_i$ information bit positions comprised in $L_i$ target segments in the $i^{th}$ second sub-position sequence to $S_i$ shaping bit positions, to obtain the first position sequence, wherein $L_i$ information bit positions indicate $L_i$ target segments, $L_i$ is an integer, i=1, . . . , and $\log_2 m$, and $$\sum_{i=1}^{\log_2 m} S_i = S,$$

wherein $L_i$ is obtained based on the $i^{th}$ quantity of estimated shaping bits in $\log_2 m$ quantities of estimated shaping bits, N, and the quantity of information bits, wherein $\log_2 m$ quantities of estimated shaping bits are obtained based on N, the quantity of information bits in the to-be-coded sequence, and wherein the modulation order and $\log_2 m$ quantities of estimated shaping bits are used to determine the first quantity.

9. The method according to claim 5, wherein determining the first quantity of the shaping bits based on N, the quantity of information bits, and the modulation order comprises:

obtaining $\log_2 m$ quantities of estimated shaping bits based on N, the quantity of information bits in the to-be-coded sequence, and the modulation order, wherein m is the modulation order; and determining the first quantity of shaping bits based on $\log_2 m$ quantities of estimated shaping bits, N, and the quantity of information bits.

10. The method according to claim 9, wherein obtaining the $i^{th}$ quantity of estimated shaping bits in $\log_2 m$ quantities of estimated shaping bits comprises:

determining a shaping target probability based on N, the quantity of information bits, and the modulation order, wherein the $i^{th}$ component in the shaping target probability indicates a probability that the $i^{th}$ bit in each modulation symbol is 0; and determining the $i^{th}$ quantity of estimated shaping bits based on the probability that the $i^{th}$ bit in the modulation symbol is 0, N, and the modulation order.

11. The method according to claim 9, wherein determining the first quantity of shaping bits based on $\log_2 m$ quantities of estimated shaping bits, N, and the quantity of information bits in the to-be-coded sequence comprises:

determining $\log_2 m$ quantities of shaping bit segments based on $\log_2 m$ quantities of estimated shaping bits, N, and the quantity of information bits, wherein the $i^{th}$ quantity $L_i$ of shaping bit segments is obtained based on the $i^{th}$ quantity of estimated shaping bits in $\log_2 m$ quantities of estimated shaping bits, N, and the quantity of information bits, wherein the $i^{th}$ quantity $L_i$ of shaping bit segments is a quantity of segments that are in the $i^{th}$ first sub-position sequence and that comprise shaping bits, and the first position sequence comprises $$\left\lceil \frac{M_1}{\log_2 m} \right\rceil$$

segments, and wherein each segment comprises $M_2$ positions, i=1, . . . , and $\log_2 m$; and determining the first quantity of shaping bits based on $\log_2 m$ quantities of shaping bit segments and the quantity of information bits.

12. A coding apparatus comprising an input interface, a logic circuit, and an output interface, wherein
the input interface is configured to obtain information bits;
the logic circuit is configured to perform the coding method according to claim 1 based on the information bits, to obtain a coded sequence; and
the output interface is configured to output the coded sequence.

13. A coding apparatus comprising:
a memory configured to store processor-executable instructions; and
a processor configured to execute the processor-executable instructions to enable the coding apparatus to:
obtain a to-be-coded sequence whose length is N,
wherein the to-be-coded sequence is obtained after an information bit is placed at an information bit position, a frozen bit is placed at a frozen bit position, and first preset bits are placed at a plurality of shaping bit positions in a first position sequence,
wherein bits associated with the plurality of shaping bit positions after polar coding belong to a plurality of different subcodes of inner code, and
wherein shaping bit positions whose corresponding bits after polar coding belong to a same subcode of inner code belong to a same group of shaping bit positions; and a coding module configured to:
perform outer code coding on the to-be-coded sequence to obtain a first outer code sequence whose length is N;
obtain, in parallel based on the first outer code sequence, a plurality of first outer code codeword bits associated with a plurality of groups of shaping bit positions,
wherein the plurality of first outer code codeword bits are the same as the bits associated with the plurality of shaping bit positions after outer code coding;
obtain a target outer code sequence based on the first outer code sequence and the plurality of first outer code codeword bits,
wherein the target outer code sequence is the same as a sequence obtained after outer code coding; and
perform inner code coding on the target outer code sequence to obtain and output a coded sequence.

14. The apparatus according to claim 13, wherein the first outer code sequence comprises a second outer code codeword bit associated with an information bit position obtained after outer code coding and a third outer code codeword bit associated with a first frozen bit position obtained after outer code coding, and wherein generation of the third outer code codeword bit is not related to the bits at the plurality of shaping bit positions; and
wherein the processor is further configured to execute the processor-executable instructions to enable the coding apparatus to:
obtain, based on one or more outer code codeword bits in the second outer code codeword bits and/or the third outer code codeword bits, the first outer code codeword bit associated with the first shaping bit position group by using polar decoding,
wherein the first outer code codeword bit associated with the first shaping bit position group is the same as a bit associated with a first shaping bit position obtained after outer code coding,
wherein a bit associated with the first shaping bit position group after polar coding and a bit associated with a target position belong to a same subcode of inner code, and
wherein a bit associated with the target position after outer code coding is a target outer code codeword bit.

15. The apparatus according to claim 14, wherein before obtaining the first target outer code codeword bit based on the target outer code codeword bit by using polar decoding, the processor is further configured to execute the processor-executable instructions to enable the coding apparatus to:
determine a first length $$\left\lceil \frac{M_1}{\log_2 m} \right\rceil$$

based on N, a modulation order, and a signal-to-noise ratio, wherein the first position sequence comprises $\log_2 m$ first sub-position sequences, the first sub-position sequences comprise $$\left\lceil \frac{M_1}{\log_2 m} \right\rceil$$

segments, each segment comprises $M_2$ positions, $M_1 \times M_2 = N$, m is the modulation order, and $M_1$ and $M_2$ both are positive integers; and
determine a polar code of the first length; and
wherein obtaining the first target outer code codeword bit associated with the first shaping bit position group based on the target outer code codeword bit by using polar decoding comprises:
performing first order decoding on the polar code of the first length based on the target outer code codeword bit to obtain the first outer code codeword bit associated with the first shaping bit position group.

16. The apparatus according to claim 13, wherein processor is further configured to execute the processor-executable instructions to enable the coding apparatus to:
obtain a second outer code sequence whose length is N, wherein bits in the second outer code sequence that correspond to the plurality of shaping bit positions are the plurality of first outer code codeword bits, and wherein a bit other than the plurality of first outer code codeword bits in the second outer code sequence is a second preset bit;
perform system coding on the second outer code sequence to obtain a third outer code sequence whose length is N, wherein bits in the third outer code sequence that correspond to the plurality of shaping bit positions are the plurality of first outer code codeword bits,
wherein a bit in the third outer code sequence that corresponds to a position of a second frozen bit is a fourth outer code codeword bits, another bit in the third outer code sequence is the second preset bit, the fourth outer code codeword bit is the same as a bit associated with the position of the second frozen bit obtained after outer code coding, and
wherein the second frozen bit is a frozen bit other than the first frozen bit in the to-be-coded sequence; and
obtain the target outer code sequence based on the first outer code sequence and the third outer code sequence.

17. The apparatus according to claim 13, wherein before obtaining the to-be-coded sequence whose length is N, the processor is further configured to execute the processor-executable instructions to enable the coding apparatus to:
  determine a first quantity of the shaping bits based on N, a quantity of information bits in the to-be-coded sequence, and the modulation order; and
  determine the information bit position, a frozen shaping bit position, and shaping bit positions of the first quantity in the first position sequence based on the first quantity, N, and the quantity of information bits.

18. The apparatus according to claim 17, wherein the processor is further configured to execute the processor-executable instructions to enable the coding apparatus to:
  determine a second position sequence based on the first quantity, N, and the quantity of information bits,
    wherein the second position sequence comprises K+S information bit positions and N−(K+S) frozen bit positions, wherein K is the quantity of information bits, and wherein S is the first quantity; and
  determine S shaping bit positions from K+S information bit positions in the second position sequence, based on N and the quantity of information bits in the to-be-coded sequence, to obtain the first position sequence.

19. A non-transitory computer readable medium comprising a computer program which upon execution by a process of a coding apparatus causes the coding apparatus to implement the following operations including:
  obtaining a to-be-coded sequence whose length is N, wherein the to-be-coded sequence is obtained after an information bit is placed at an information bit position, a frozen bit is placed at a frozen bit position, and first preset bits are placed at a plurality of shaping bit positions in a first position sequence, wherein bits associated with the plurality of shaping bit positions after polar coding belong to a plurality of different subcodes of inner code, and wherein shaping bit positions whose corresponding bits after polar coding belong to a same subcode of inner code belong to a same group of shaping bit positions;
  performing outer code coding on the to-be-coded sequence to obtain a first outer code sequence whose length is N;
  obtaining, in parallel based on the first outer code sequence, a plurality of first outer code codeword bits associated with a plurality of groups of shaping bit positions, wherein the plurality of first outer code codeword bits is the same as the bits associated with the plurality of shaping bit positions after outer code coding;
  obtaining a target outer code sequence based on the first outer code sequence and the plurality of first outer code codeword bits, wherein the target outer code sequence is the same as a sequence obtained after outer code coding; and
  performing inner code coding on the target outer code sequence to obtain and output a coded sequence.

20. A non-transitory computer readable medium according to claim 19, wherein the first outer code sequence comprises a second outer code codeword bit associated with an information bit position obtained after outer code coding and a third outer code codeword bit associated with a first frozen bit position obtained after outer code coding and, wherein generation of the third outer code codeword bit is not related to the bits at the plurality of shaping bit positions; and
  wherein obtaining the first outer code codeword bit associated with any first shaping bit position group in the plurality of groups of shaping bit positions comprises:
    obtaining, based on one or more outer code codeword bits in the second outer code codeword bits and/or the third outer code codeword bits, the first outer code codeword bit associated with the first shaping bit position group by using polar decoding,
      wherein the first outer code codeword bit associated with the first shaping bit position group is the same as a bit associated with a first shaping bit position obtained after outer code coding,
      wherein a bit associated with the first shaping bit position group after polar coding and a bit associated with a target position belong to a same subcode of inner code, and
      wherein a bit associated with the target position after outer code coding is a target outer code codeword bit.

* * * * *

UNITED STATES PATENT AND TRADEMARK OFFICE
CERTIFICATE OF CORRECTION

| | |
|---|---|
| PATENT NO. | : 12,052,097 B2 |
| APPLICATION NO. | : 18/186912 |
| DATED | : July 30, 2024 |
| INVENTOR(S) | : Wang et al. |

Page 1 of 1

It is certified that error appears in the above-identified patent and that said Letters Patent is hereby corrected as shown below:

In the Claims

Claim 13, Column 37, Line 29: reads as "positions; and a coding module configured to:" should read -- positions; and --.

Signed and Sealed this
Fourteenth Day of October, 2025

John A. Squires
*Director of the United States Patent and Trademark Office*